US011348632B2

(12) United States Patent
Gopalan et al.

(10) Patent No.: US 11,348,632 B2
(45) Date of Patent: *May 31, 2022

(54) DOUBLE DATA RATE (DDR) MEMORY CONTROLLER APPARATUS AND METHOD

(71) Applicant: UNIQUIFY, INC., San Jose, CA (US)

(72) Inventors: Mahesh Gopalan, Milpitas, CA (US); David Wu, Saratoga, CA (US); Venkat Iyer, Sunnyvale, CA (US)

(73) Assignee: UNIQUIFY, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/909,871

(22) Filed: Jun. 23, 2020

(65) Prior Publication Data

US 2020/0321044 A1 Oct. 8, 2020

Related U.S. Application Data

(63) Continuation of application No. 16/584,600, filed on Sep. 26, 2019, now Pat. No. 10,734,061, which is a
(Continued)

(51) Int. Cl.
G11C 11/4076 (2006.01)
G11C 11/4096 (2006.01)
(Continued)

(52) U.S. Cl.
CPC ........... G11C 11/4076 (2013.01); G06F 1/04 (2013.01); G06F 1/08 (2013.01); G06F 1/12 (2013.01); G06F 1/14 (2013.01); G06F 3/065 (2013.01); G06F 3/067 (2013.01); G06F 3/0619 (2013.01); G06F 12/0646 (2013.01); G06F 13/1689 (2013.01); G06F 13/4243 (2013.01); G11C 7/1072 (2013.01); G11C 7/222 (2013.01); G11C 11/4093 (2013.01); G11C 11/4096 (2013.01); G11C 29/022 (2013.01);
(Continued)

(58) Field of Classification Search
CPC ............ G11C 11/4076; G11C 11/4093; G11C 29/022; G11C 29/023; G11C 7/1072; G11C 7/222; G11C 29/028; G11C 11/4096; G11C 11/40; G11C 7/04; G06F 3/0619; G06F 3/065; G06F 3/067; G06F 13/1689; G06F 13/4243; G06F 12/0646; G06F 1/04; G06F 1/08; G06F 1/12; G06F 1/14
USPC ......................................... 365/193
See application file for complete search history.

(56) References Cited

U.S. PATENT DOCUMENTS 7,590,008 B1* 9/2009 Roge .................... G11C 29/028
365/194

* cited by examiner

Primary Examiner — Fernando Hidalgo
(74) Attorney, Agent, or Firm — Procopio, Cory, Hargreaves & Savitch LLP

(57) ABSTRACT

In accordance with one embodiment, a computer-implemented method is provided, comprising the act of: configuring code or hardware to cause at least part of the hardware to operate as a double data rate (DDR) memory controller and to: produce a capture clock to time a read data path, where a timing of the capture clock is based on a first clock signal of a first clock, delay the first clock signal to produce a delayed first clock signal, adjust the delay such that at least one clock edge of the delayed first clock signal is placed nearer to at least one clock edge of: at least one data strobe (DQS), or at least one signal dependent on a DQS timing, and produce a modified timing of the capture clock based on the delay of the first clock signal.

104 Claims, 26 Drawing Sheets

Related U.S. Application Data continuation of application No. 16/296,025, filed on Mar. 7, 2019, now Pat. No. 10,586,585, which is a continuation of application No. 16/049,693, filed on Jul. 30, 2018, now Pat. No. 10,269,408, which is a continuation of application No. 15/996,365, filed on Jun. 1, 2018, now Pat. No. 10,242,730, which is a continuation of application No. 15/926,902, filed on Mar. 20, 2018, now Pat. No. 10,032,502, which is a continuation of application No. 15/722,209, filed on Oct. 2, 2017, now Pat. No. 10,229,729, which is a continuation of application No. 15/249,188, filed on Aug. 26, 2016, now Pat. No. 9,805,784, which is a continuation of application No. 14/882,226, filed on Oct. 13, 2015, now Pat. No. 9,431,091, which is a continuation-in-part of application No. 14/752,903, filed on Jun. 27, 2015, now Pat. No. 9,552,853, which is a continuation of application No. 14/152,902, filed on Jan. 10, 2014, now Pat. No. 9,081,516, which is a continuation of application No. 14/023,630, filed on Sep. 11, 2013, now Pat. No. 8,843,778, which is a continuation of application No. 13/172,740, filed on Jun. 29, 2011, now Pat. No. 8,661,285, which is a continuation-in-part of application No. 12/157,081, filed on Jun. 6, 2008, now Pat. No. 7,975,164.

(60) Provisional application No. 62/063,136, filed on Oct. 13, 2014.

(51) Int. Cl.

| | |
|---|---|
| *G06F 3/06* | (2006.01) |
| *G06F 13/16* | (2006.01) |
| *G06F 13/42* | (2006.01) |
| *G11C 7/10* | (2006.01) |
| *G11C 7/22* | (2006.01) |
| *G11C 29/02* | (2006.01) |
| *G06F 12/06* | (2006.01) |
| *G06F 1/04* | (2006.01) |
| *G06F 1/08* | (2006.01) |
| *G06F 1/12* | (2006.01) |
| *G06F 1/14* | (2006.01) |
| *G11C 11/4093* | (2006.01) |
| *G11C 7/04* | (2006.01) |
| *G11C 11/40* | (2006.01) |

(52) U.S. Cl.
CPC .......... *G11C 29/023* (2013.01); *G11C 29/028* (2013.01); *G11C 7/04* (2013.01); *G11C 11/40* (2013.01)

DDR controller with core clock synchronization
- Read Datapath -

DOUBLE DATA RATE (DDR) MEMORY CONTROLLER APPARATUS AND METHOD

PRIORITY CLAIM

This application claims priority as a Continuation of U.S. patent application Ser. No. 16/584,600 filed on Sep. 26, 2019, currently pending, the contents of which are incorporated by reference.

U.S. patent application Ser. No. 16/584,600 claimed priority as a Continuation of U.S. patent application Ser. No. 16/296,025 filed on Mar. 7, 2019, registered as U.S. Pat. No. 10,586,585 on Mar. 10, 2020, the contents of which are incorporated by reference.

U.S. patent application Ser. No. 16/296,025 claimed priority as a Continuation of U.S. patent application Ser. No. 16/049,693 filed on Jul. 30, 2018, registered as U.S. Pat. No. 10,269,408 on Apr. 23, 2019, the contents of which are incorporated by reference.

U.S. patent application Ser. No. 16/049,693 claimed priority as a Continuation of U.S. patent application Ser. No. 15/996,365, filed on Jun. 1, 2018, registered as U.S. Pat. No. 10,242,732 on Mar. 26, 2019, the contents of which are incorporated by reference.

U.S. patent application Ser. No. 15/996,365 claimed priority as a Continuation of U.S. patent application Ser. No. 15/926,902, filed on Mar. 20, 2018 registered as U.S. Pat. No. 10,032,502 on Jul. 24, 2018, the contents of which are incorporated by reference.

U.S. patent application Ser. No. 15/926,902 claimed priority as a Continuation of U.S. patent application Ser. No. 15/722,209, filed on Oct. 2, 2017, registered as U.S. Pat. No. 10,229,729 on Mar. 12, 2019, the contents of which are incorporated by reference.

U.S. patent application Ser. No. 15/722,209 claimed priority as a Continuation of U.S. patent application Ser. No. 15/249,188, filed on Aug. 26, 2016, registered as U.S. Pat. No. 9,805,784 on Oct. 31, 2017, the contents of which are incorporated by reference.

U.S. patent application Ser. No. 15/249,188 claimed priority as a Continuation of U.S. patent application Ser. No. 14/882,226, filed on Oct. 13, 2015, registered as U.S. Pat. No. 9,431,091 on Aug. 30, 2016, the contents of which are incorporated by reference.

U.S. patent application Ser. No. 14/882,226, in turn claimed priority as a NonProvisional Patent Application of U.S. Provisional Patent Application Ser. No. 62/063,136, filed on Oct. 13, 2014, commonly assigned with the present application and incorporated herein by reference.

U.S. patent application Ser. No. 14/882,226 also claimed priority as a Continuation-In-Part of U.S. Utility patent application Ser. No. 14/752,903, filed on Jun. 27, 2015, registered as U.S. Pat. No. 9,552,853 on Jan. 24, 2017, which in turn claims priority as a Continuation of U.S. Utility patent application Ser. No. 14/152,902, filed on Jan. 10, 2014, registered as U.S. Pat. No. 9,081,516 on Jul. 14, 2015, which in turn claimed priority as a Continuation of U.S. Utility patent application Ser. No. 14/023,630, filed on Sep. 11, 2013, registered as U.S. Pat. No. 8,843,778 on Sep. 23, 2014, which in turn claimed priority as a Continuation of U.S. Utility patent application Ser. No. 13/172,740, filed Jun. 29, 2011, registered as U.S. Pat. No. 8,661,285 on Feb. 25, 2014, which in turn claimed priority as a Continuation-In-Part of U.S. Utility patent application Ser. No. 12/157,081, filed on Jun. 6, 2008, registered as U.S. Pat. No. 7,975,164 on Jul. 5, 2011, all commonly assigned with the present application and incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to circuits that interface with memories, in particular DDR or "double data rate" dynamic memories. Such circuits are found in a wide variety of integrated circuit devices including processors, ASICs, and ASSPs used in a wide variety of applications, as well as devices whose primary purpose is interfacing between memories and other devices.

BACKGROUND

Double Data Rate, or "DDR" memories are extremely popular due to their performance and density, however they present challenges to designers. In order to reduce the amount of real estate on the memory chips, much of the burden of controlling the devices has been offloaded to circuits known as DDR memory controllers. These controller circuits may reside on Processor, ASSP, or ASIC semiconductor devices, or alternately may reside on semiconductor devices dedicated solely to the purpose of controlling DDR memories. Given the high clock rates and fast edge speeds utilized in today's systems, timing considerations become challenging and it is often the case that timing skews vary greatly from one system implementation to another, especially for systems with larger amounts of memory and a greater overall width of the memory bus.

In general, the industry has responded by moving towards memory controllers that attempt to calibrate themselves during a power-on initialization sequence in order to adapt to a given system implementation. Such an approach has been supported by the DDR3 standard where a special register called a "Multi-Purpose Register" is included on the DDR3 memories in order for test data to be written prior to the calibration test performed during power-on initialization. The circuitry on memory controllers typically used for receiving data from DDR memories normally incorporates features into the Phy portion (Physical interface) of the memory controller circuit where the controller can adapt to system timing irregularities, this adaptation sometimes being calibrated during a power-on initialization test sequence.

FIG. 1 Shows a typical prior art DDR memory controller where an Asynchronous FIFO 101 is utilized to move data from the clocking domain of the Phy 102 to the Core clock domain 103. Incoming read data dq0 is clocked into input registers 105 and 106, each of these input registers being clocked on the opposite phase of a delayed version of the dqs clock 107, this delay having been performed by delay element 108.

Asynchronous FIFO 101 typically consists of at least eight stages of flip-flops requiring at least 16 flip-flops in total per dq data bit. Notice also that an additional circuit 109 for delay and gating of dqs has been added prior to driving the Write Clock input of FIFO 101. This is due to the potential that exists for glitches on dqs. Both data and control signals on a typical DDR memory bus are actually bidirectional. As such, dqs may float at times during the transition between writes and reads, and as such be susceptible to glitches during those time periods. For this reason, typical prior art in DDR controller designs utilizing asynchronous FIFOs add gating element 109 to reduce the propensity for errors due to glitches on dqs. After passing through the entire asynchronous FIFO 101, read data is transferred to the core domain according to Core_Clk 110. Additional circuitry is typically added to FIFO 101 in order to deal with timing issues relative to potential metastable conditions given the unpredictable relationship between Core_Clk and dqs.

FIG. 2 shows another prior art circuit for implementing a DDR memory controller, in particular a style utilized by the FPGA manufacturer Altera Corp. Portions of two byte lanes are shown in FIG. 2, the first byte lane represented by data bit dq0 201 and corresponding dqs strobe 202. The second byte lane is represented by dqs strobe 203 and data bit dq0 204. In general, the data and strobe signals connecting between a DDR memory and a DDR memory controller are organized such that each byte or eight bits of data has its own dqs strobe signal. Each of these groupings is referred to as a byte lane.

Looking at the data path starting with dq data bit 201 and dqs strobe 202, these pass through programmable delay elements 205 and 206 respectively before being stored in capture registers 207 and 208. Eventually these signals pass through a series of registers 209, 210, and 211 which are clocked by signals coming from tapped delay line 213. These registers form what is called a levelization FIFO and attempt to align the data bits within a byte lane relative to other byte lanes. Tapped delay line 213 is driven by a PLL re-synchronization clock generator 214 which also drives the final stage registers 212 of the levelization FIFO as well as being made available to the core circuitry of the controller. The PLL resynchronization clock generator 214 is phase and frequency synchronized with dqs. Notice that at this point, data stored in final stage registers 212 has not yet been captured by the core clock of the memory controller. Also notice that the circuit of FIG. 2 utilizes an individual delay element for each data bit such as dq0 201 and dq0 204.

When we examine fully-populated byte lanes, it should be noted that the additional delay elements required to provide an individual programmable delay on all incoming data bits can consume a large amount of silicon real estate on the device containing a DDR memory controller circuit. Such a situation is shown in FIG. 3 where a single dqs strobe 301 requires a single programmable delay 302, while the eight data bits 303 of the byte lane each drive a programmable delay element 304.

FIG. 4 describes some of the timing relationships that occur for a prior art DDR memory controller which uses delay elements within the Phy for individual read data bits. FIG. 4a shows a simplified diagram where a single data bit is programmably delayed by element 401 in addition to the dqs strobe being delayed by element 402. Typically data from input dq is captured on both the rising and falling edges of dqs as shown in FIGS. 1 and 2, however for the sake of simplicity, the diagrams of FIGS. 3-12 only show the schematic and timing for the dq bits captured on the rising edge of dqs. By controlling both of these two delays, the output of capture register 403 can be delayed by any amount within the range of the delay elements before it is passed into the core clock domain and clocked into register 404 by the Core_Clk signal 405. In FIG. 4b, the dqs_delayed signal 406 is placed near the center of the valid window for dq 407 and after being captured in register 403, data then enters the core domain at clock edge 408 is shown as shown. In this scenario the latency to move the data into the core domain is relatively low simply because of the natural relationship between core clock and dqs. This relationship however is extremely dependent upon the system topology and delays, and in fact could have almost any phase relationship.

A different phase relationship is possible as shown in FIG. 4c. Here, a first edge 409 of Core_Clk happens to occur just before the leading edge 410 of dqs_delayed. The result is that each data bit will not be captured in the core clock domain until leading edge 411 of Core_Clk as shown, and thus will be delayed by amount of time 412 before being transferred into the core domain. Thus, while the ability to delay both dq and dqs can accomplish synchronization with the core clock, it may introduce a significant amount of latency in the process.

A DDR memory controller circuit and method is therefore needed that reliably captures and processes memory data during read cycles while requiring a small gate count resulting in implementations requiring a small amount of silicon real estate. The controller should also offer a high yield for memory controller devices as well as a high yield for memory system implementations using those controller devices. Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system warms during operation.

Further it is useful to have a memory controller circuit that can perform a portion of calibration operations while allowing a signal gating window that is large, and then can perform further calibration operations and functional operation with an optimized signal gating window.

Also, given the ever increasing clock rates that memories are capable of, it is useful to perform calibration and functional operation with some number of related signals within a memory controller operating at half the frequency of memory strobe signals such as DQS.

SUMMARY

In accordance with one embodiment, a computer-implemented method is provided, comprising the act of: configuring code or hardware to cause at least part of the hardware to operate as a double data rate (DDR) memory controller and to: produce a capture clock to time a read data path, where a timing of the capture clock is based on a first clock signal of a first clock, delay the first clock signal to produce a delayed first clock signal, adjust the delay such that at least one clock edge of the delayed first clock signal is placed nearer to at least one clock edge of: at least one data strobe (DQS), or at least one signal dependent on a DQS timing, and produce a modified timing of the capture clock based on the delay of the first clock signal.

Also shown in FIGS. 19-22 are circuit details and timing relationships for a memory interface that operates at substantially half a DQS clock rate, or a reduced clock rate, such that data can be captured accurately and calibration performed accurately even as primary clock rates for memories increase over successive technology generations.

FIGS. 23-26 depict additional details of the half frequency operation, pursuant to one embodiment of the invention.

DETAILED DESCRIPTION OF THE INVENTION

In contrast to prior art DDR memory controllers where calibration features for timing inconsistencies are implemented only in the Phy portion of the controller, the DDR memory controller of one embodiment of the present invention focuses on utilizing core domain clocking mechanisms, at times combined with circuitry in the Phy, to implement an improved solution for a timing-adaptive DDR memory controller.

Figure 4:
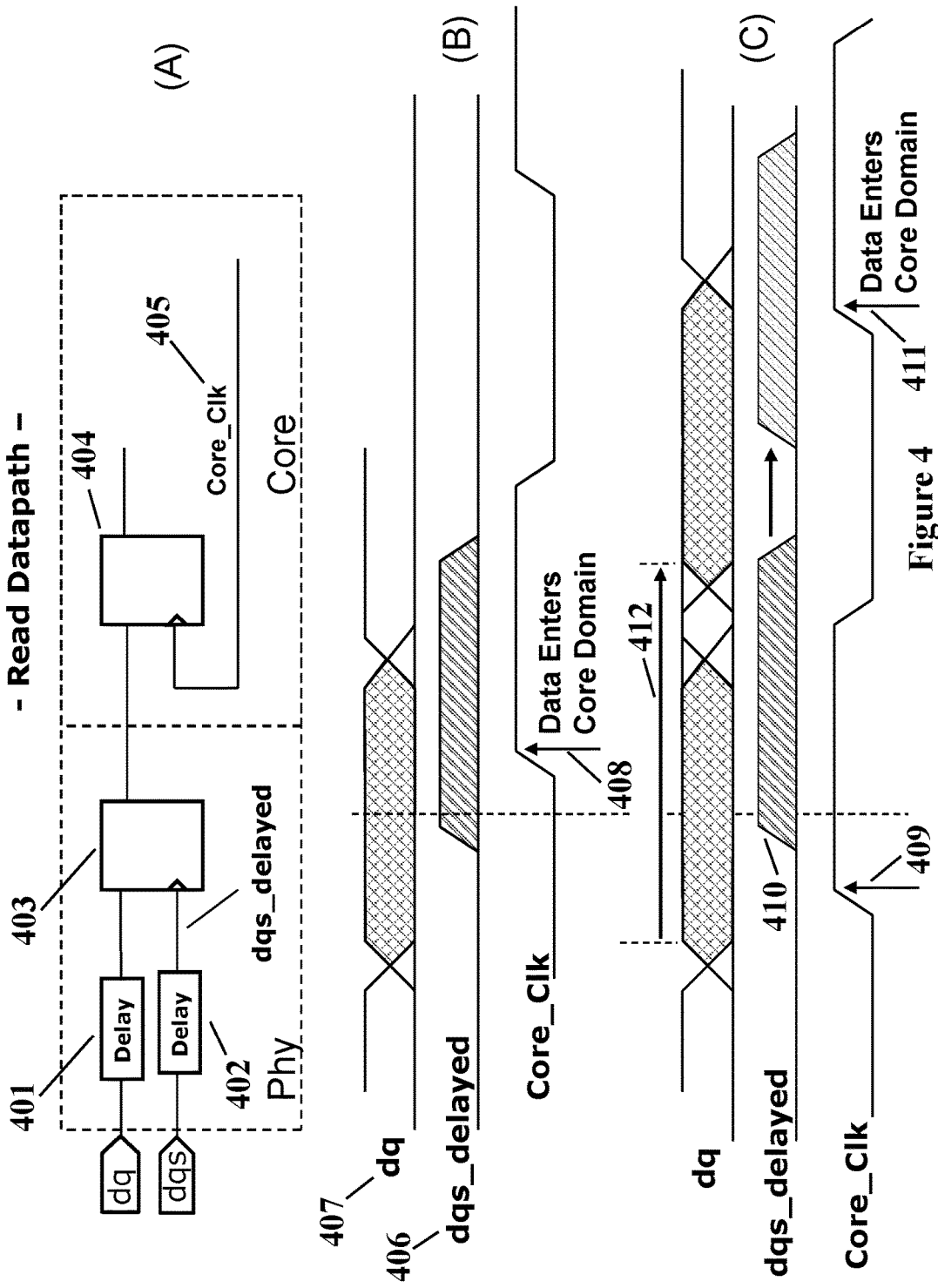
FIG. 4 shows the data capture and synchronization timing for the read data path of a prior art DDR memory controller having delay elements on both dq and dqs inputs.
Figure 5:
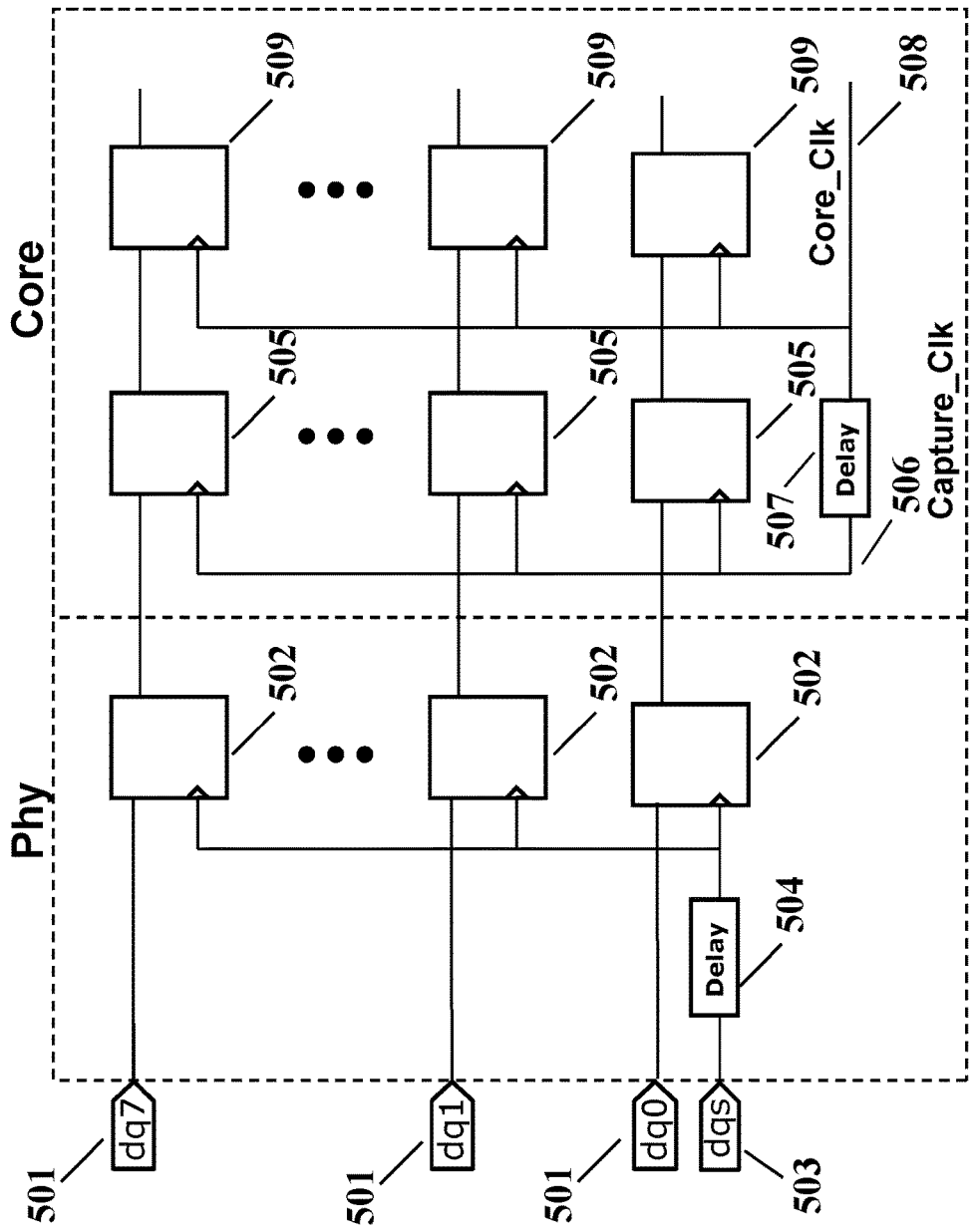
FIG. 5 shows the read data path for a DDR memory controller according to an embodiment of the present invention where delay elements are used on dqs but not on dq inputs, and read data synchronization is performed with the core clock by way of a core clock delay element.

In contrast with the prior art circuit of FIG. 4, FIG. 5 shows a simplified version of a DDR controller circuit according to an embodiment of the present invention. Here, the data inputs for a byte lane 501 are shown being captured in dq read data registers 502 without any additional delay elements added, these registers being clocked by a delayed version of dqs. The dqs clock signal 503 has dqs delay element 504 added, typically delaying dqs by approximately 90 degrees relative to the dqs signal driven by the DDR memory. The outputs of registers 502 enter the core domain and are captured in first core domain registers 505. Registers 505 are clocked by a delayed version of Core_Clk called Capture_Clk 506. Capture_Clk is essentially the output of core clock delay element 507 which produces a programmably delayed version of Core_Clk 508. The outputs of first core domain registers 505 feed second core domain registers 509 which are clocked by Core_Clk. The amount of delay assigned to programmable delay element 507 is controlled by a self-configuring logic circuit (SCL) contained within the memory controller, this self-configuring logic circuit determining the appropriate delay for element 507 during a power-on initialization test and calibration operation.

Figure 6:
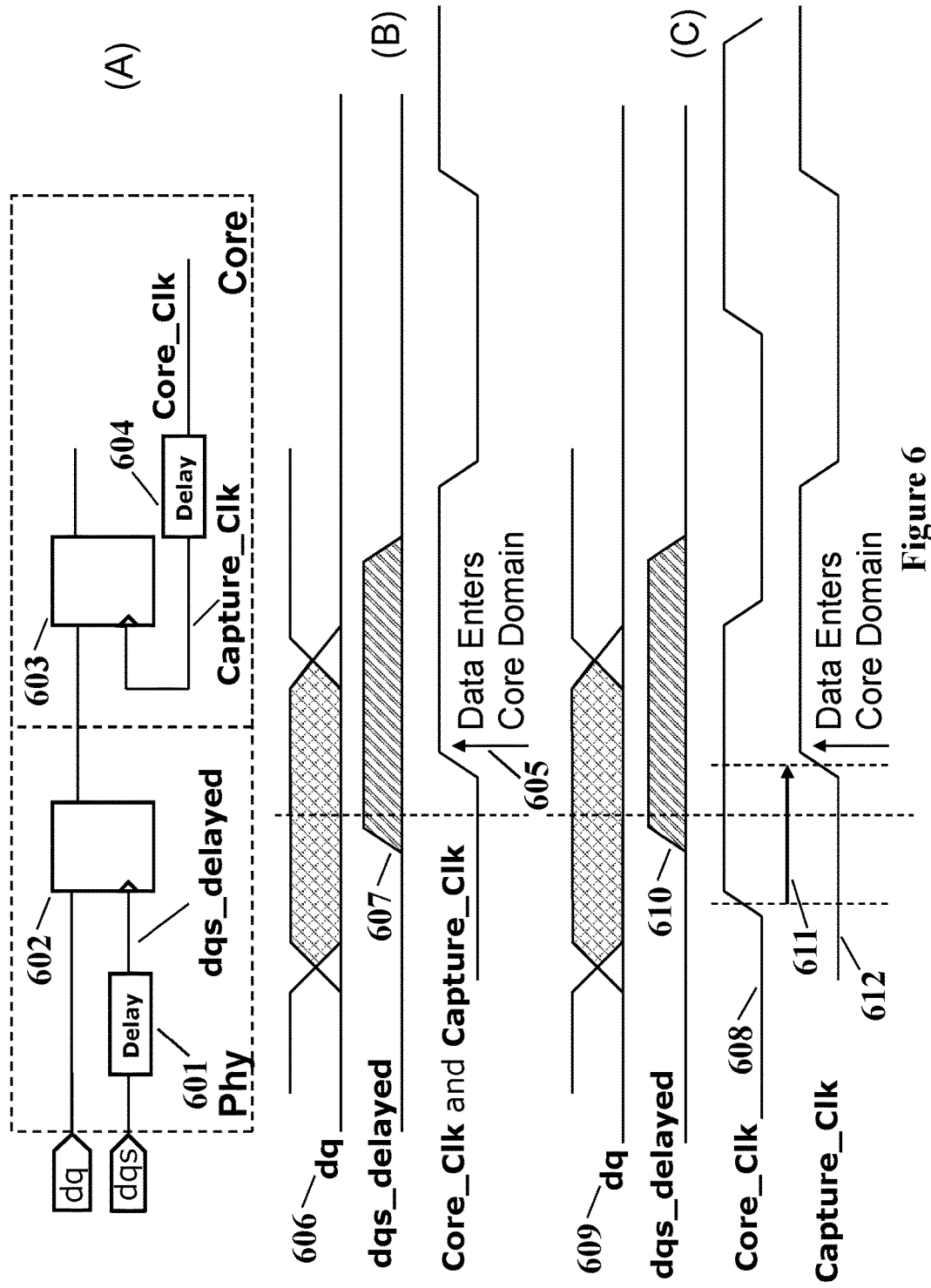
FIG. 6 shows the data capture and synchronization timing for the read data path of a DDR memory controller according to an embodiment of the present invention where delay elements are used on dqs but not on dq inputs, and read data synchronization is performed with the core clock by way of a core clock delay element.

FIG. 6 shows how the timing for the read data path can occur for the DDR memory controller circuit of one embodiment of the present invention. A simplified version of the read data path is shown in FIG. 6a where dqs is delayed by dqs delay element 601 which clocks dq into Phy data capture register 602. The output of data capture register 602 then feeds the first core domain register 603 which is clocked by Capture_Clk, the output of core clock delay element 604. The timing scenario shown in FIG. 6 occurs when the active edge of Core_Clk 605 (depicted in FIG. 6(b)) occurs just after dq data 606 has been clocked into Phy data capture register 602 by dqs_delayed 607. In this scenario, data can be immediately clocked into first core domain register 603, and thus delay element 604 may be programmably set to a delay of essentially zero, making the timing for Capture_Clk essentially the same as Core_Clk.

FIG. 6(c) a shows another timing scenario where the active edge of Core_Clk 608 occurs just prior to dq data 609 being clocked into Phy data capture register 602 by dqs_delayed 610. As a result, core clock delay element 604 will be programmed with delay 611 such that first core domain register 603 is clocked on the active edge of Capture_Clk 612. Thus, regardless of the natural timing of Core_Clk relative to dqs, Capture_Clk will be positioned such that data will move from the Phy domain to the core domain in a predictable manner with minimal added latency due to random clock alignment.

Figure 7:
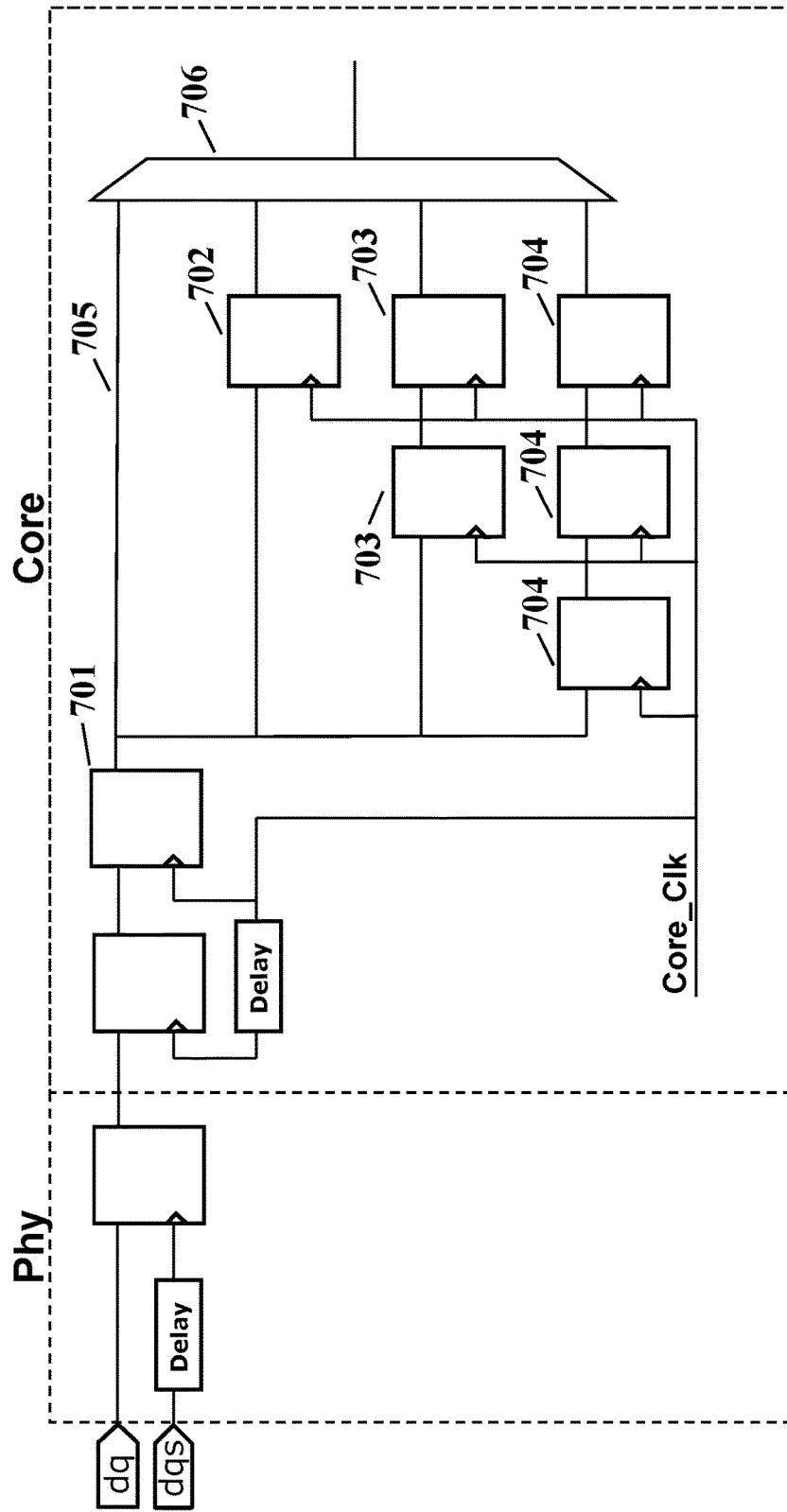
FIG. 7 shows the read data path for a DDR memory controller according to one embodiment of the present invention including a CAS latency compensation circuit which is clocked by the core clock.

FIG. 7 shows an embodiment for the present invention including a circuit that compensates for CAS latency. According to Wikipedia: "CAS latency (CL) is the time (in number of clock cycles) that elapses between the memory controller telling the memory module to access a particular column in the current row, and the data from that column being read from the module's output pins. Data is stored in individual memory cells, each uniquely identified by a memory bank, row, and column. To access DRAM, controllers first select a memory bank, then a row (using the row address strobe, RAS), then a column (using the CAS), and finally request to read the data from the physical location of the memory cell. The CAS latency is the number of clock cycles that elapse from the time the request for data is sent to the actual memory location until the data is transmitted from the module." Thus, there is a timing unpredictability in any system implementation involving DDR memory between the read request from the controller to the memory and the resulting data actually arriving back at the memory controller. The amount of this timing unpredictability can be determined during the power-on initialization test and calibration operation, and then compensated for by the circuit shown in FIG. 7 where the output of second core domain register 701 feeds a partially populated array of registers 702, 703, and 704, which along with direct connection path 705 feed multiplexer 706. These registers are all clocked by Core_Clk and thus create different numbers of clock cycles of CAS latency compensation depending upon which input is selected for multiplexer 706. During the power-on initialization test and calibration operation, different inputs for multiplexer 706 will be selected at different times during the test in order to determine which of the paths leading to multiplexer 706 is appropriate in order to properly compensate for the CAS delay in a particular system installation.

Figure 1:
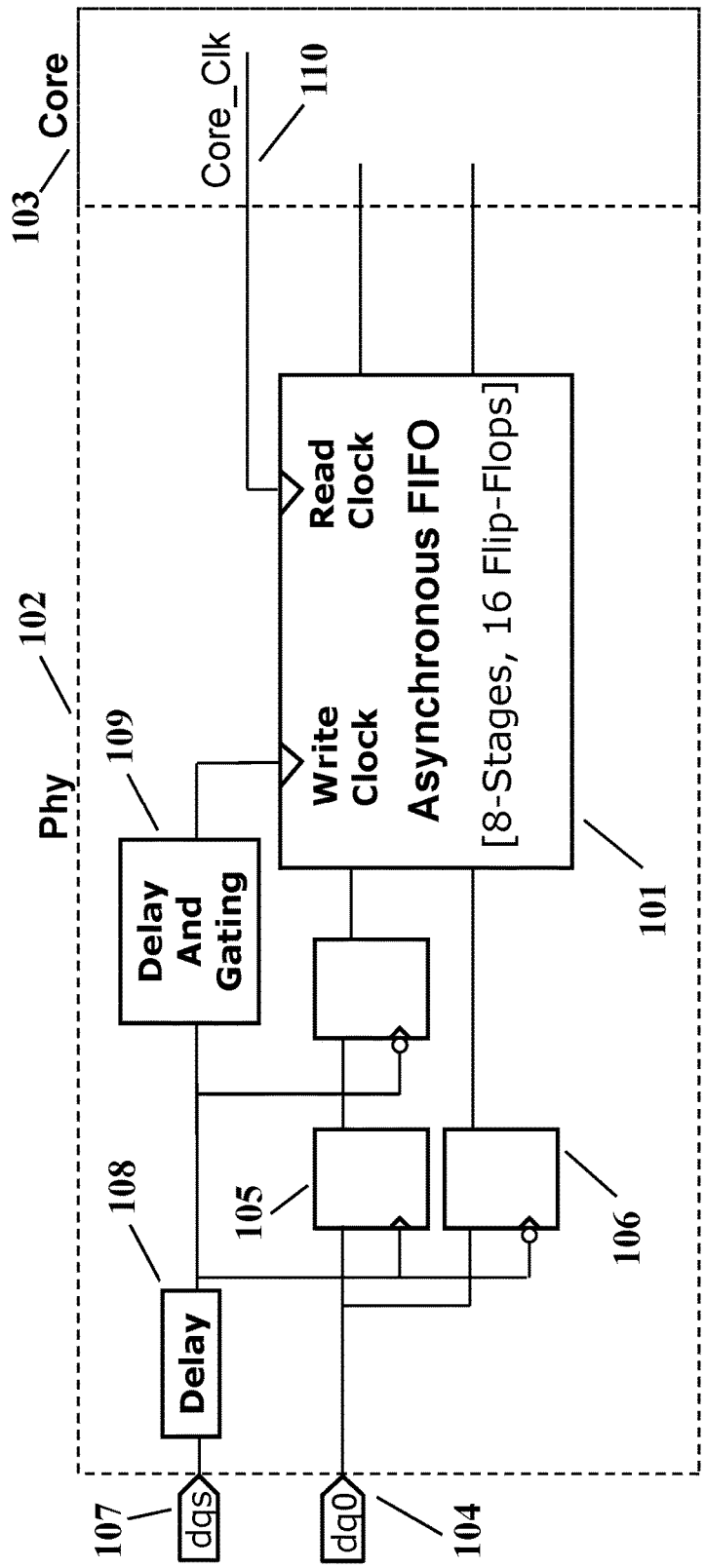
FIG. 1 shows a prior art DDR memory controller which utilizes an asynchronous FIFO with gated clock, all contained within the Phy portion of the controller circuit.
Figure 8:
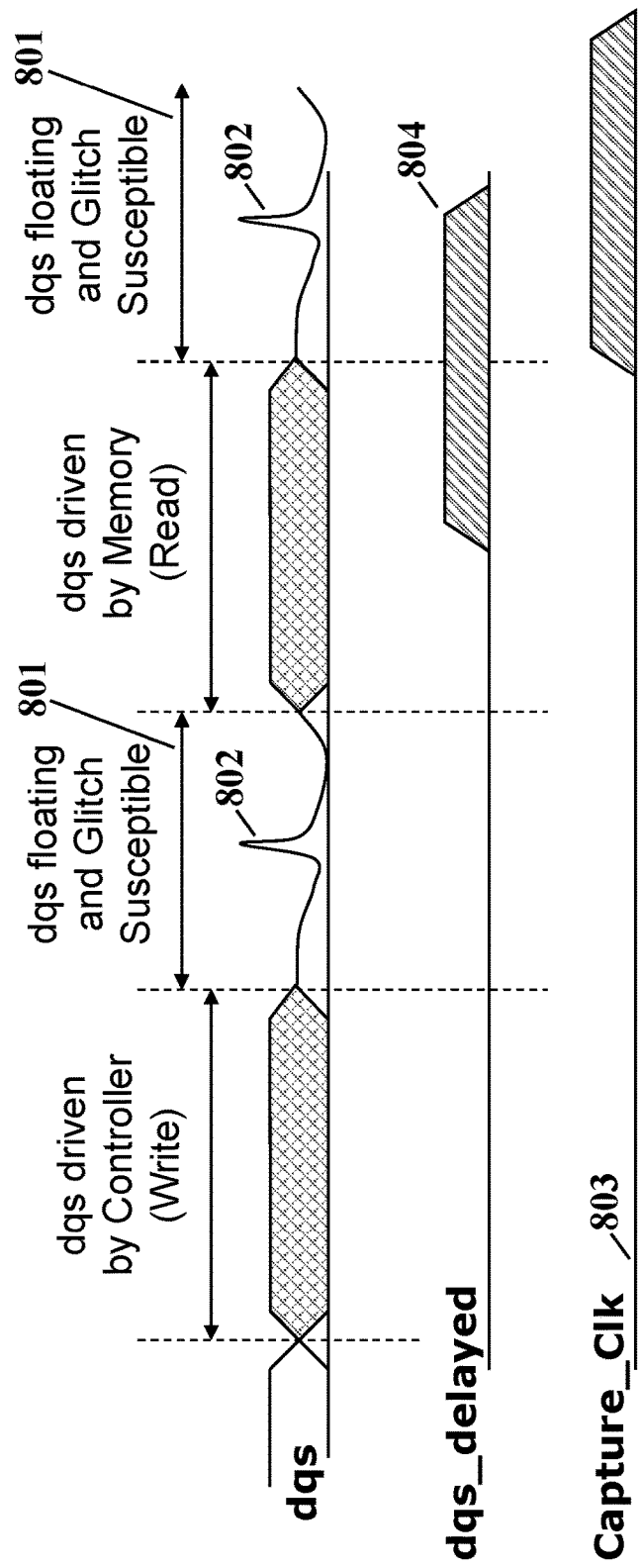
FIG. 8 shows the glitch problem which can occur on the bidirectional dqs signal in DDR memory systems.

In the earlier discussion with reference to FIG. 1, it was mentioned that delay and gating element 109 was included in order to lower the propensity for spurious glitches on dqs inadvertently clocking FIFO 101. The timing diagram of FIG. 8 shows this problem in more detail. During the normal sequence of operation of a DDR memory, the dqs strobe is first driven by the memory controller during a write cycle and then, during a read cycle it is driven by the DDR memory. In between, the there is a transitional time period 801 where the dqs connection may float, that is not be driven by either the memory or the controller. During time periods 801, it is possible for glitches 802 to be induced in dqs from a variety of sources including cross coupling from edges on other signals on boards or in the IC packages for the memory and/or the controller. In order to minimize the chance of any glitch on dqs causing data corruption, the embodiment of the present invention as shown in FIGS. 5 through 7 allows capture clock 803 to be optimally positioned relative to dqs_delayed 804 such that read data is always moved into the core clock domain as early as possible.

Figure 2:
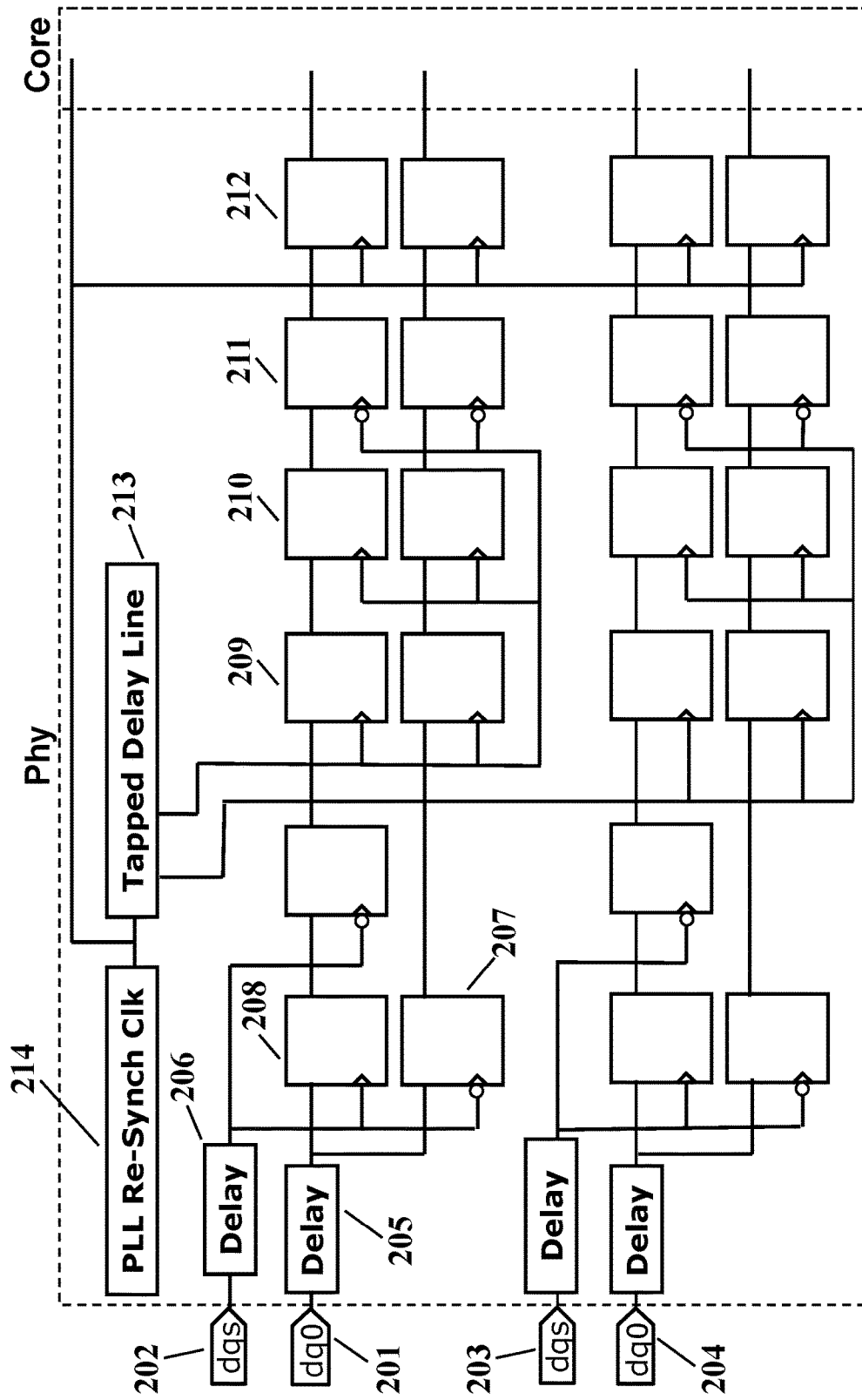
FIG. 2 shows a prior art DDR memory controller where delay elements are used on both dq and dqs signals and a form of FIFO is used for data levelization, the FIFO being clocked by a clock that is PLL-synchronized with dqs, the entire circuit contained within the Phy portion of the memory controller.
Figure 3:
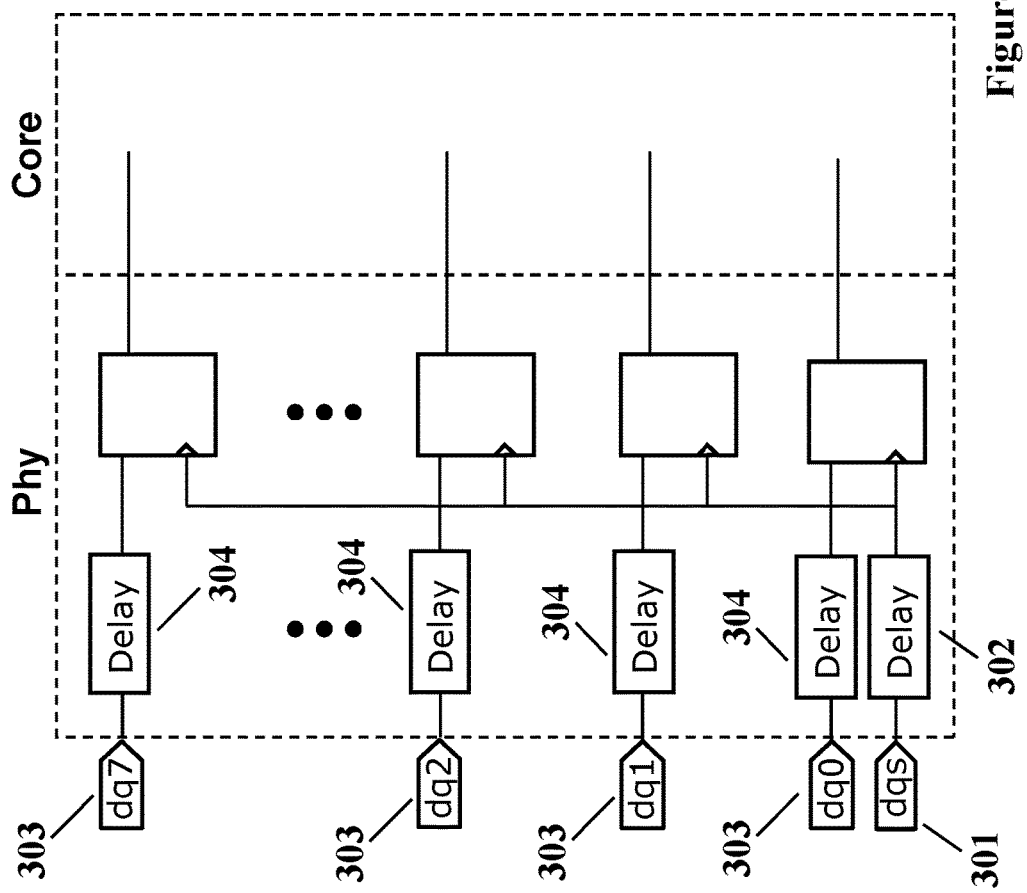
FIG. 3 describes the read data path for a prior art DDR memory controller having delay elements on both dq and dqs inputs.
Figure 9:
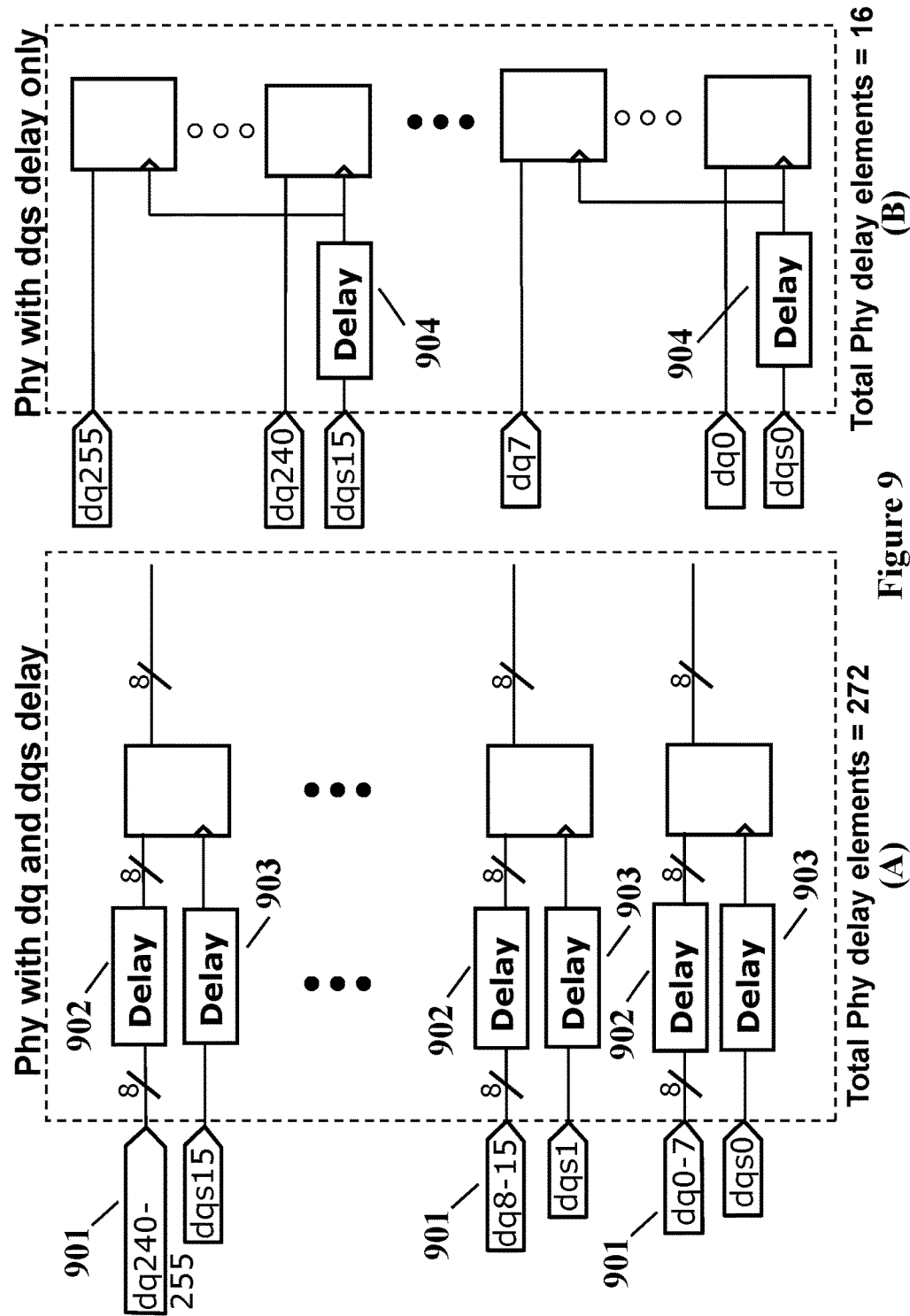
FIG. 9 shows a comparison of prior art memory controllers which utilize delay elements on both dq and the dqs inputs when compared with the memory controller of one embodiment of the present invention, with emphasis on the number of total delay elements required for each implementation.

FIG. 9 shows a comparison between an embodiment the present invention and prior art memory controllers according to FIGS. 2 through 4, with emphasis on the amount of silicon real estate required based on the numbers of delay elements introduced for an example implementation containing a total of 256 data bits. Notice in FIG. 9a that prior art memory controllers that include delay elements on all dq data bits 901 would require 256 delay elements 902 for dq inputs in addition to 16 delay elements 903 for dqs inputs. In contrast to this, FIG. 9b shows an implementation according to one embodiment of the present invention where only dqs input delay elements 904 are required and therefore the total number of delay elements in the Phy for an embodiment the present invention is 16 versus 272 for the prior art implementation of FIG. 9a.

Figure 10:
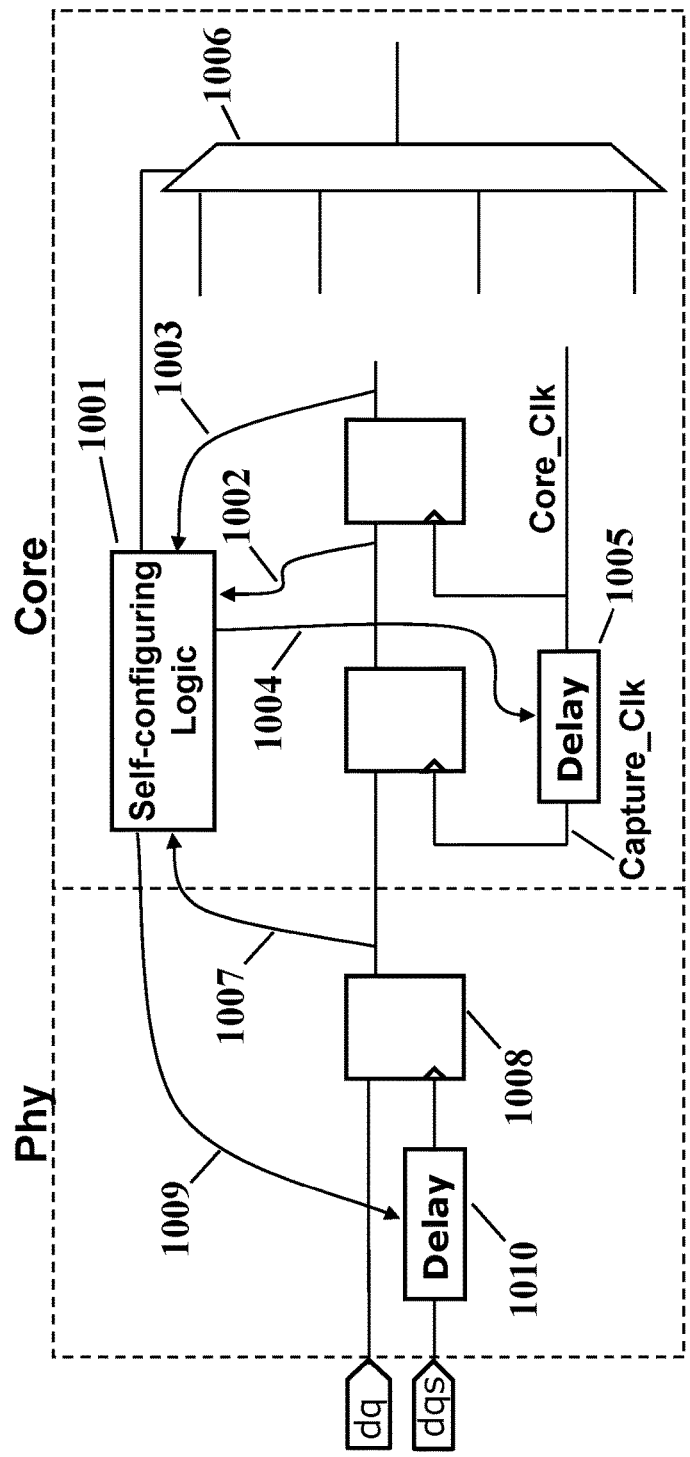
FIG. 10 shows a diagram for the read data path of a DDR memory controller according to one embodiment of the present invention with emphasis on the inputs and outputs for the Self Configuring Logic function which controls the programmable delay elements.

FIG. 10 shows a diagram of how the Self Configuring Logic (SCL) function 1001 interfaces with other elements of the DDR memory controller according to an embodiment of the present invention. In a first embodiment of the present invention, the SCL 1001 receives the output 1002 of the first core domain register (clocked by Capture_Clk) as well as the output 1003 of the second core domain register (clocked by Core_Clk). In turn, the SCL provides output 1004 which controls the delay of the delay element 1005 which creates Capture_Clk. The SCL also drives multiplexer 1006 which selects the different paths which implement the CAS latency compensation circuit as previously described in FIG. 7 where multiplexer 706 performs this selection function.

In an alternate embodiment of the present invention, SCL 1001 also receives data 1007 from input data register 1008, and in turn also controls 1009 dqs delay element 1010, thereby enabling a much finer degree of control for the dqs delay function than is normally utilized in most memory controller designs, as well as allowing the dqs delay to be initialized as part of the power on initialization test and calibration operation.

Figure 11:
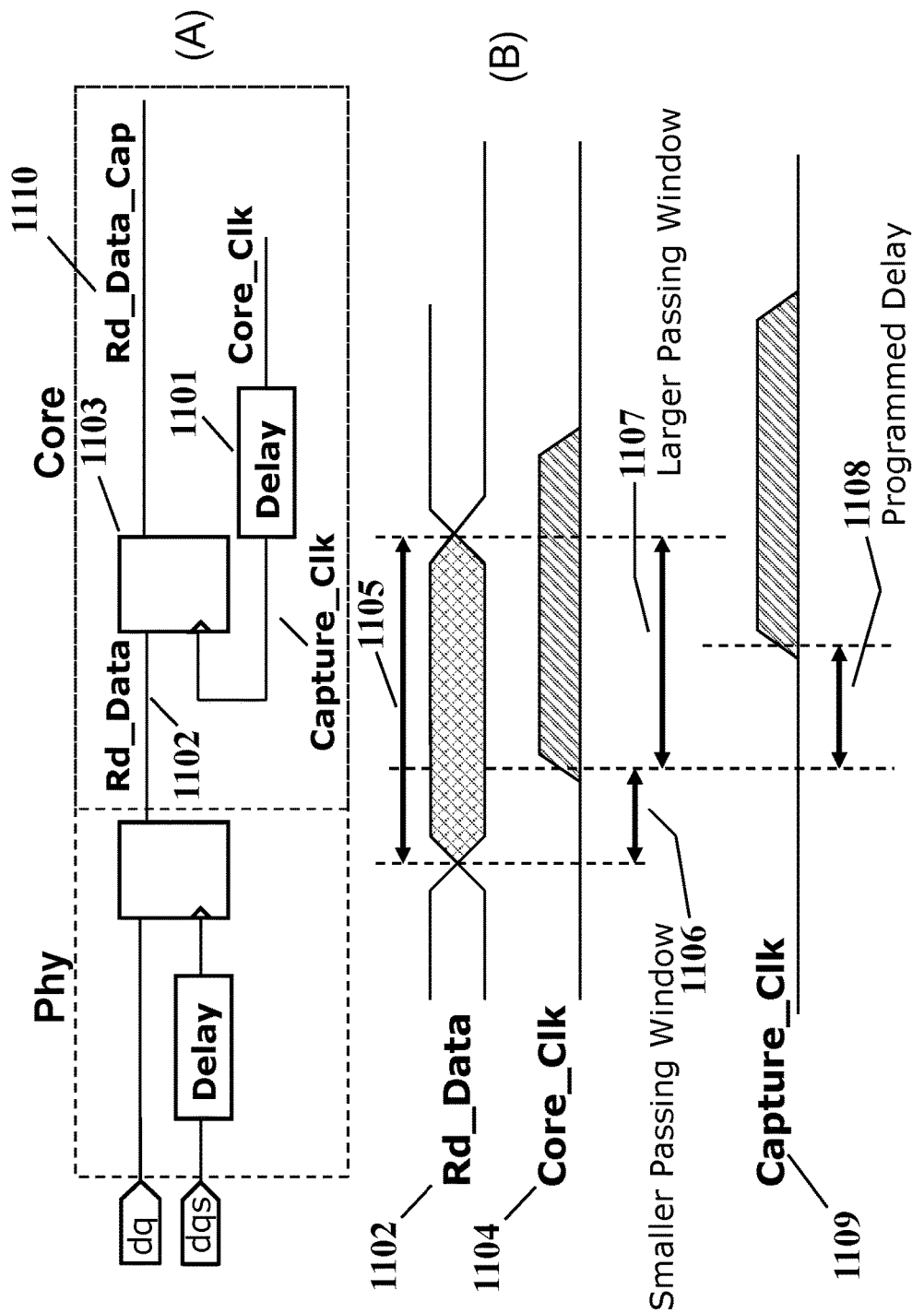
FIG. 11 describes the timing relationships involved in choosing the larger passing window when the delay element producing Capture_Clk is to be programmed according to one embodiment of the present invention.

FIG. 11 describes the concept behind the process for choosing the larger passing window when positioning Capture_Clk. As described previously for an embodiment the present invention, the core clock signal is delayed in element 1101 as shown in FIG. 11a to produce Capture_Clk. FIG. 11b shows a timing diagram where the RD_Data signal 1102 is to be captured in first core domain register 1103. As shown in FIG. 11b, the position of core clock 1104 rarely falls in the center of the time that RD_Data 1102 is valid, in this instance being position towards the beginning of the valid time period 1105 for RD_Data. In this instance, two passing windows 1106 and 1107 have been created, with 1106 being the smaller passing window and 1107 being the larger passing window.

Therefore in the scenario shown in FIG. 11b, some amount of programmed delay 1108 would be programmed into delay element 1101 in order that Capture_Clk 1109 may be positioned in the larger passing window 1107.

Figure 12:
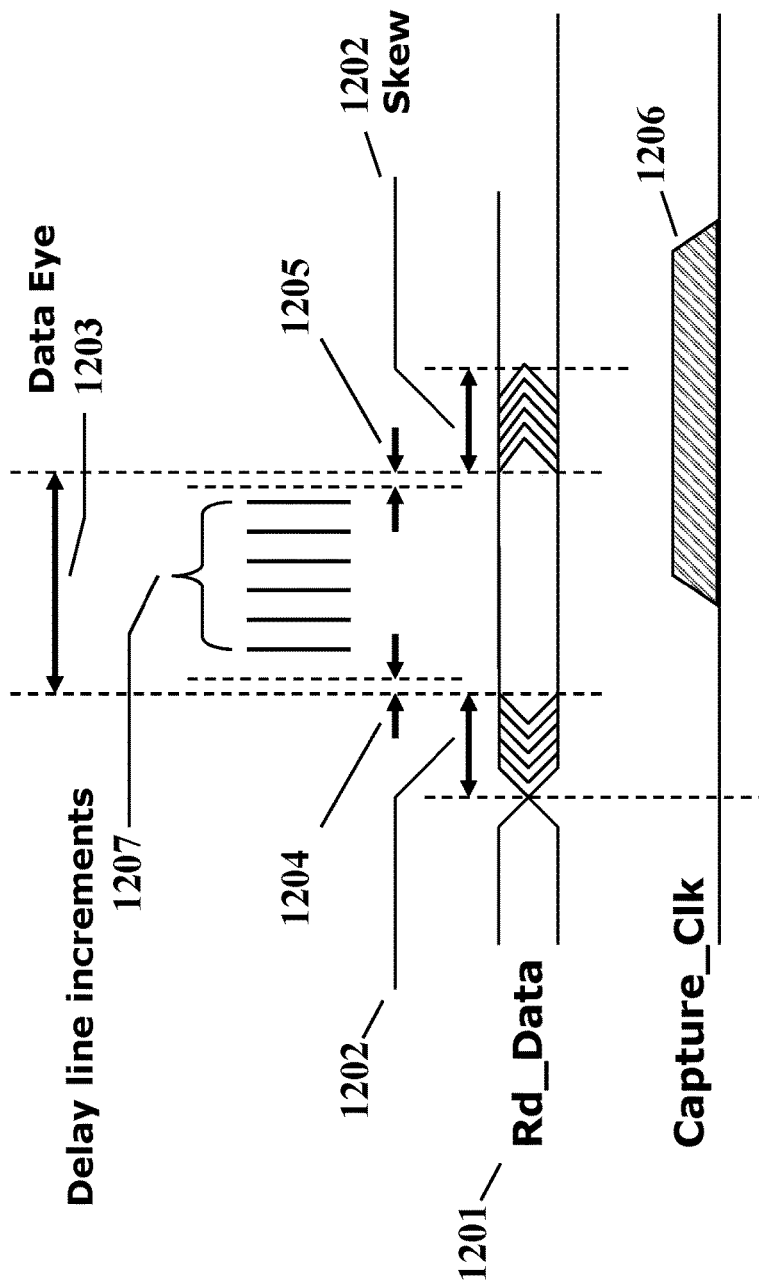
FIG. 12 shows a timing diagram for the data eye indicating the common window for valid data across a group of data bits such as a byte lane, given the skew that exists between all the data bits.

FIG. 12 shows a timing diagram for a group of data bits in a byte lane such as Rd_Data 1201 where the timing skew 1202 across the group of bits is shown as indicated. The common time across all data bits in the group where data is simultaneously valid is called the data eye 1203. After subtracting setup time 1204 and hold time 1205 from data eye 1203, what remains is the window within which Capture_Clk 1206 may be placed in order to properly clock valid data on all bits of Rd_Data 1201 within the byte lane. Delay line increments 1207 represent the possible timing positions that may be chosen for a programmable delay line to implement core clock delay element 604 that produces Capture_Clk. For all systems there will be a minimum number of delay line increments 1207 for which the power on initialization test will determine that data is captured successfully, achieving that minimum number being necessary for the manufacturer of the system to feel confident that the timing margin is robust enough for a production unit to be declared good. Thus, this number of delay line increments that is seen as a minimum requirement for a successful test is specified and stored in the system containing the memory controller, and is utilized in determining if the power-on initialization and calibration test is successful.

Figure 13:
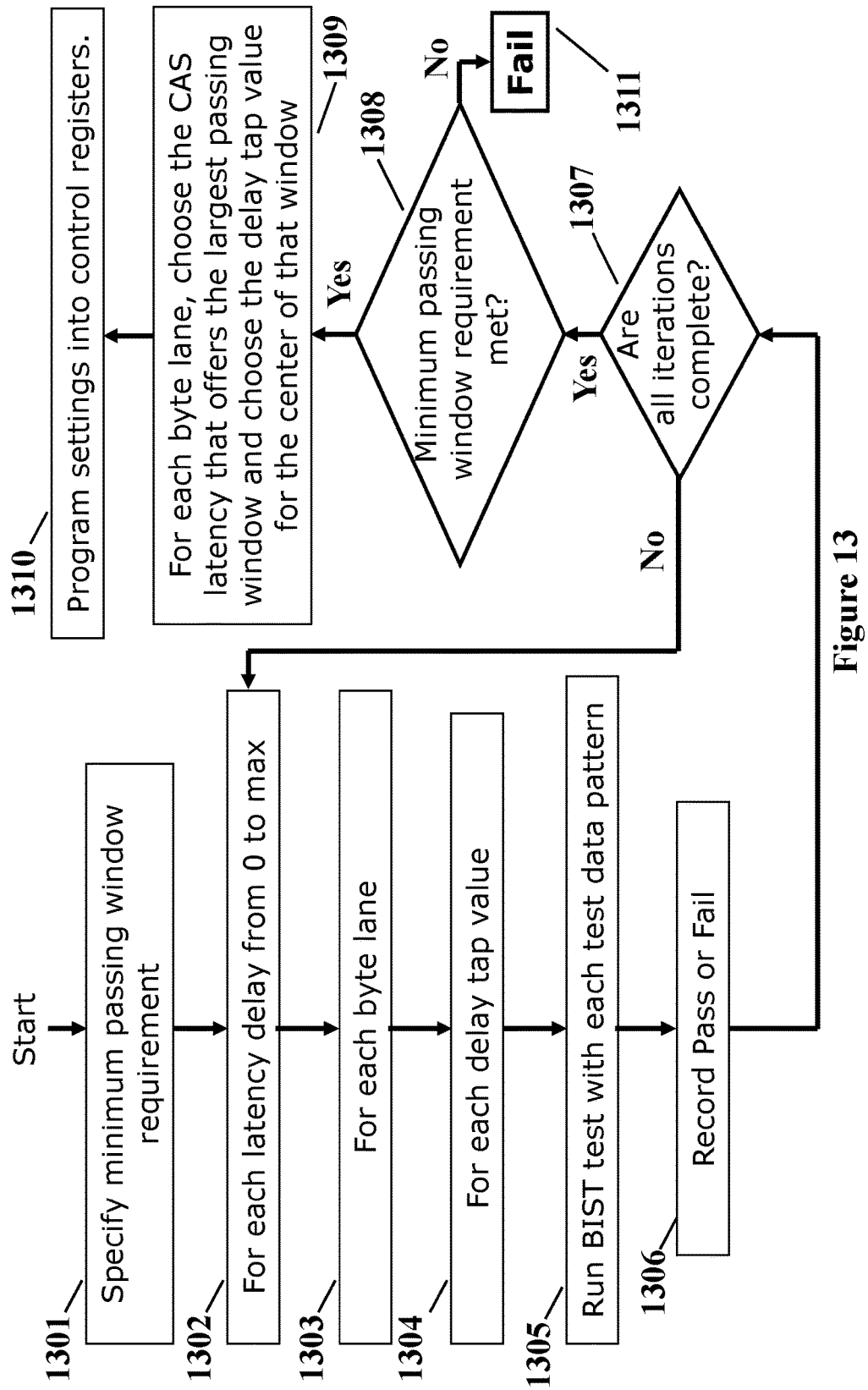
FIG. 13 shows a flow chart for the power-on initialization test and calibration operation according to one embodiment of the present invention, the results of this operation including choosing programmable delay values.

FIG. 13 shows a flow chart for the process implemented according to one embodiment of the present invention for a power-on initialization test and calibration operation. Software or firmware controls this operation and typically runs on a processor located in the system containing the DDR memory and the controller functionality described herein. This processor may be located on the IC containing the memory controller functionality, or may be located elsewhere within the system. In step 1301, a minimum passing window requirement is specified in terms of a minimum number of delay increments for which data is successfully captured, as described in the diagram of FIG. 12. The minimum passing window requirement will be used to determine a pass or fail condition during the test, and also may be used in order to determine the number of delay increments that must be tested and how many iterations of the test loops (steps 1302 through 1307) must be performed. Steps 1302, 1303, 1304, 1305, and 1306 together implement what in general is known as nested "for" loops. Thus, for each latency delay value to be tested according to step 1302, each byte lane will be tested according to step 1303. And, for each byte lane to be tested according to step 1303, each delay tap value within a chosen range of delay tap values will be tested according to step 1304. So, for each specific permutation of latency delay, byte lane, and delay tap value, the BIST test (Built-In Self-Test for the read data test) will be run according to step 1305, and a pass or fail result will be recorded according to step 1306. Once all iterations of the nested "for" loops are completed as determined by step 1307, the processor controlling the power-on initialization and calibration test will then check (step 1308) to see if the minimum passing window requirement has been met as specified in step 1301. If the minimum has not been met, then the system will indicate a failure 1311. If the requirement has been met, then according to step 1309 for each byte lane the processor will choose the latency value that offers the largest passing window, and then choose the delay tap value the places capture clock in the center of that window. Finally, values will be programmed into control registers according to step 1310 such that all delays within the controller system according to this invention are programmed with optimum settings.

Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system environment variables (such as temperature) change during operation. DSCL, a dynamic version of the SCL or Self Configuring Logic functionality as described herein, addresses the problem of VT (voltage and temperature) variations during normal operation of a chip that utilizes a DDR memory controller as described herein to access a DRAM. Regular SCL as described earlier is typically run only on system power on. It can calibrate for the system level timing at the time it is run and can compensate for PVT (Process variations in addition to Voltage and Temperature) variations that occur from chip to chip, and do it in the context of the system operation.

Computer memory is vulnerable to temperature changes both in the controller and the corresponding memory modules. As any DDR memory chip or as the chip containing the DDR memory controller heat up, and supply voltage variations occur due to other external factors such as loading experienced by the power supply source, VT variations can cause system level timing to change. These changes can affect the optimal programming settings as compared with those that were produced by operation of the SCL function when calibration was run at power on. Thus, DSCL functionality helps the chip to continuously compensate for VT variations providing the best DRAM timing margin even as system timing changes significantly over time. By performing the necessary calibration in the shortest period of time, DSCL also ensures that the impact on system performance is minimal. DSCL divides the problem of calculating the Capture_Clk delay and the problem of CAS latency compensation into separate problems per FIGS. 16 and 18, and solves each of these problems independently. It also runs independently and parallely in each byte lane. Thus the whole calibration process is greatly speeded up. Specifically, in one embodiment, if the user has an on-board CPU, the non-dynamic SCL could be run within about 2 milliseconds assuming 4 byte lanes and 4 milliseconds for 8 byte lanes. In one embodiment of the dynamic SCL, regardless of 4 or 8 byte lanes, SCL would run within 1 micro-second.

The operation of the DSCL functionality described herein utilizes portions of the existing SCL circuitry previously described and utilizes that existing circuitry during both the calibration phase and operational phase, however new circuitry is added for DSCL and the calibration phase is broken into two sub-phases. One of these sub-phases corresponds to the process described in FIG. 16, and the other sub-phase corresponds to the process described in FIG. 18.

Figure 14:
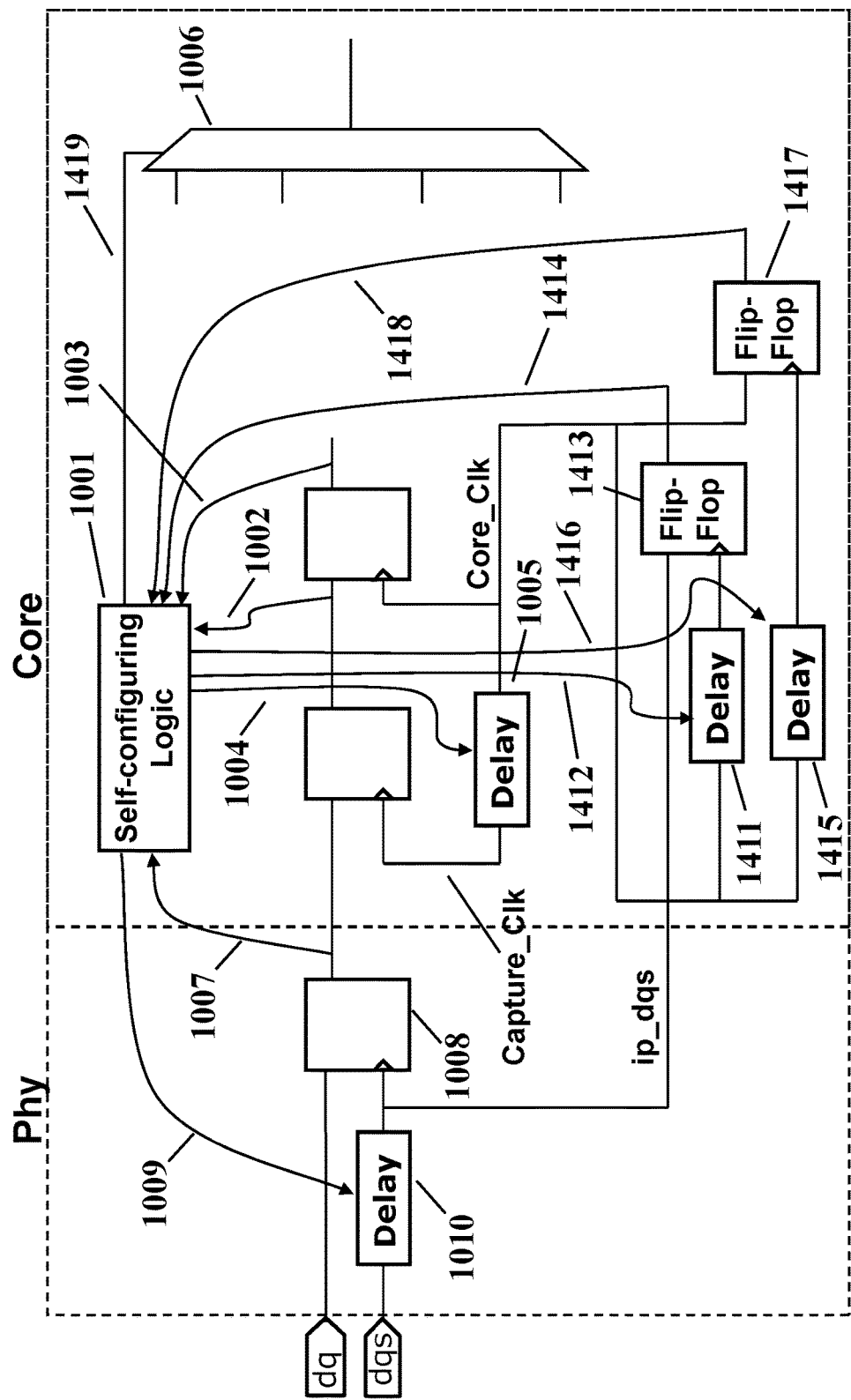
FIG. 14 shows the functionality of FIG. 10 with circuitry added to implement a dynamically calibrated DDR controller function according to one embodiment of the invention, in particular to determine an optimum Capture_Clk delay.

FIG. 14, when compared with FIG. 10, shows the circuit component additions which may be present in order to support the dynamically calibrated version of the DDR memory controller as described herein. The purpose of the additions to FIG. 10 as shown in FIG. 14 is to support the first phase of the SCL calibration whereby an optimum Capture_Clk delay is determined according to the process of FIG. 16. The optimum Capture_Clk value is determined by the Self-configuring Logic 1001 output 1004 to the Delay element 1005. Here, the delayed version of the dqs input signal produced by delay element 1010 and herein called ip_dqs is sampled in flip-flop 1413. Flip-flop 1413 is clocked by the output of delay element 1411 which delays Core_Clk. The output of flip-flop 1413 is connected 1414 to the self configuring logic function 1001. Core_Clk is also delayed in delay element 1415 which in turn samples Core_Clk in flip-flop 1417. The output of flip-flop 1417 is connected 1418 to the self configuring logic function 1001. Delay elements 1411 and 1415 are controlled respectively by signals 1412 and 1416 from self configuring logic function 1001. An output 1419 of SCL logic function 1001 controls the select lines of multiplexer 1006 which is the same multiplexer as shown earlier as multiplexer 706 in FIG. 7 and is used to select captured read data which is delayed by different increments according to which flip-flop delay chain path is most appropriate.

Figure 15:
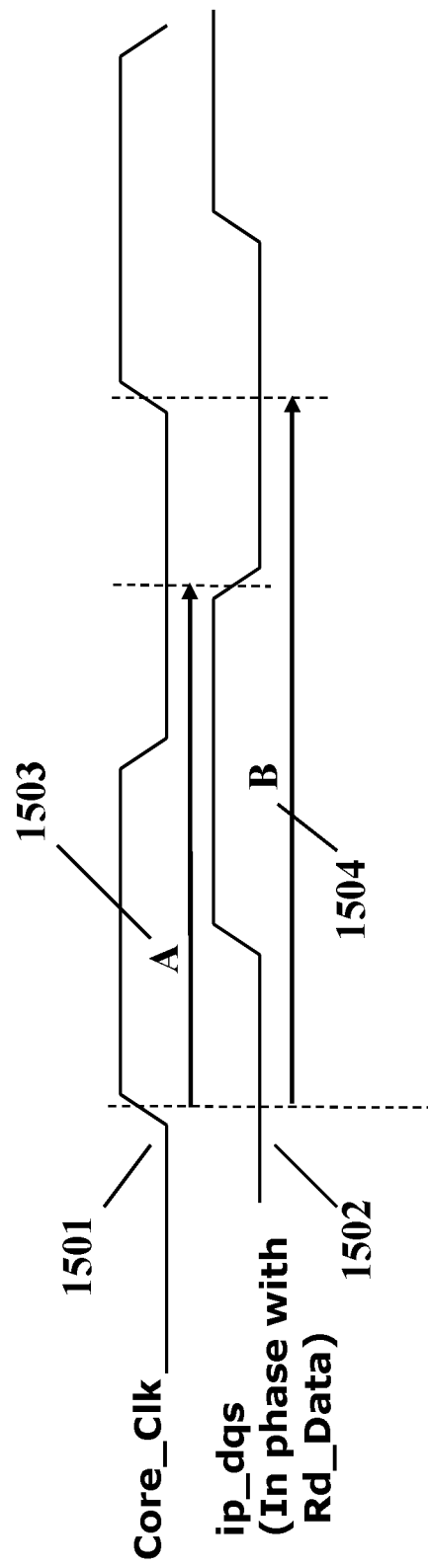
FIG. 15 shows a timing diagram where Core_Clk and ip_dqs are delayed and sampled as part of implementing a dynamically calibrated DDR controller function according to one embodiment of the invention.
Figure 16:
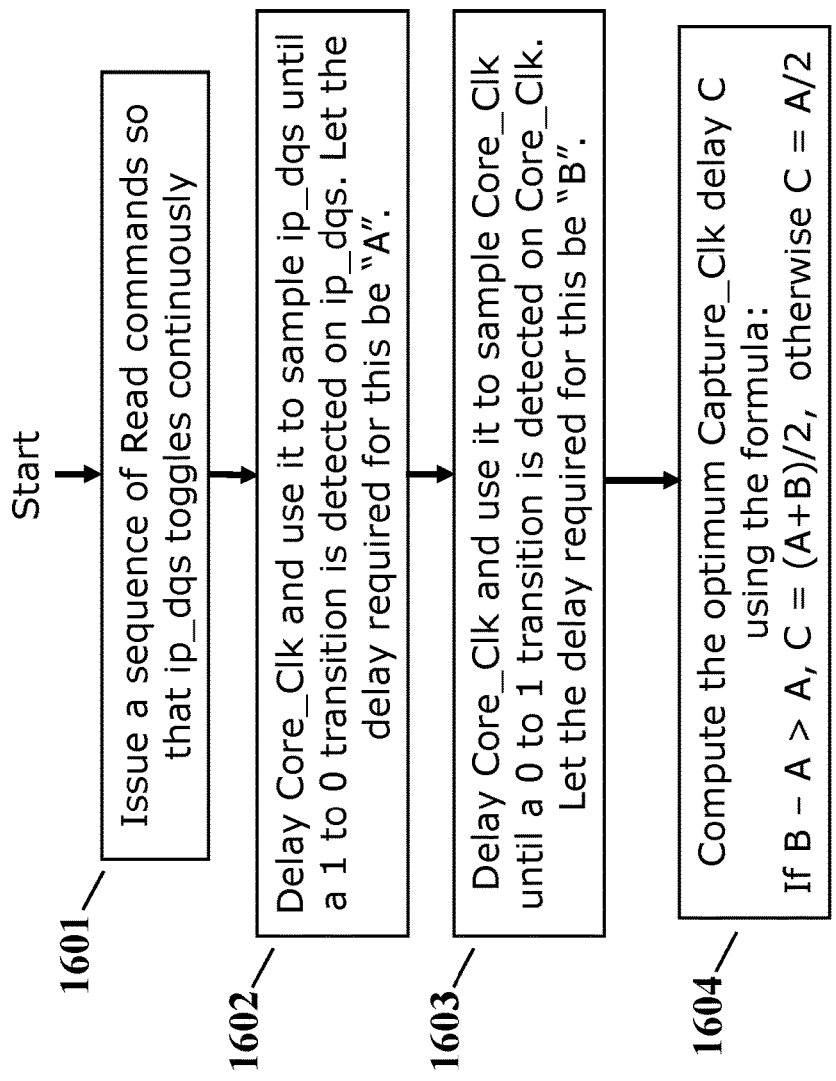
FIG. 16 shows a flowchart describing the process of delaying and sampling both ip_dqs and Core_Clk, and for computing an optimum Capture_Clk delay.

FIG. 15 graphically shows some of the timing delays that are manipulated as part of the dynamic calibration sequence of the DDR memory controller per one embodiment of the present invention and as described in FIG. 16. Here, Core_Clk 1501 is delayed by different values, here marked value "A" 1503 in FIG. 15. The ip_dqs signal 1502 is also delayed by different values, here marked value "B" 1504.

FIG. 16 shows a flowchart for the dynamic calibration procedure in order to determine an optimum delay for Core_Clk delay element 1005 in order to produce an optimum timing for the Capture_Clk signal. In step 1601, a sequence of read commands is issued so that the ip_dqs signal toggles continuously. In step 1602, the Core_Clk signal is delayed and used to sample ip_dqs at different delay increments until a 1 to 0 transition is detected on ip_dqs, whereby this value for the Core_Clk delay is recorded as value "A". In step 1603, the Core_Clk signal is delayed and used to sample Core_Clk at different delay increments until a 0 to 1 transition is detected on Core_Clk, whereby this value for the Core_Clk delay is recorded as value "B". In step 1604, the optimum delay value "C" for delaying Core_Clk in order to produce an optimum Capture_Clk signal is computed according to the formula: if B−A>A then the resulting value C=(A+B)/2, otherwise C=A/2.

Figure 17:
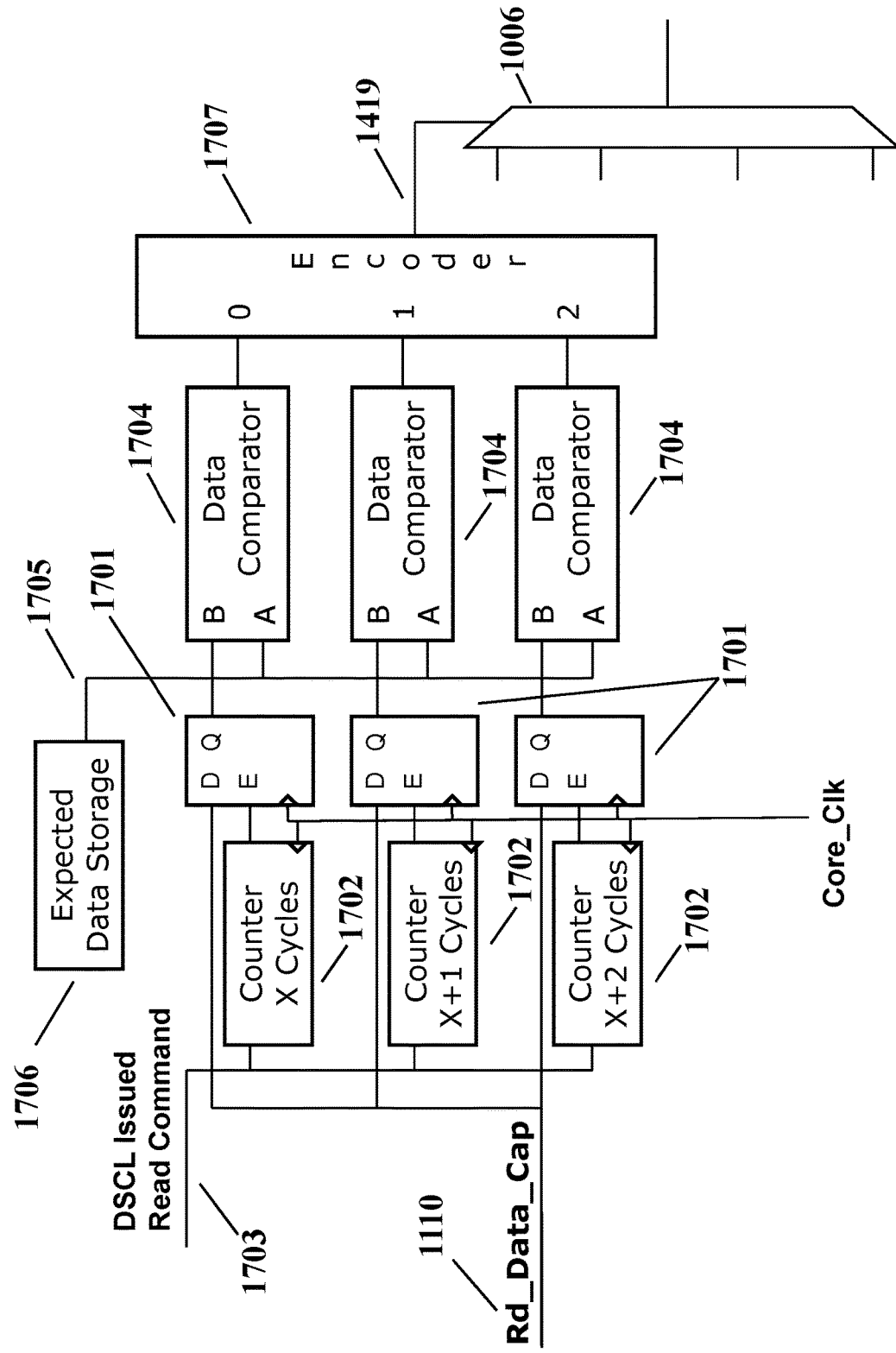
FIG. 17 includes circuitry added for dynamic calibration, in particular for a second phase according to the process of FIG. 18.
Figure 18:
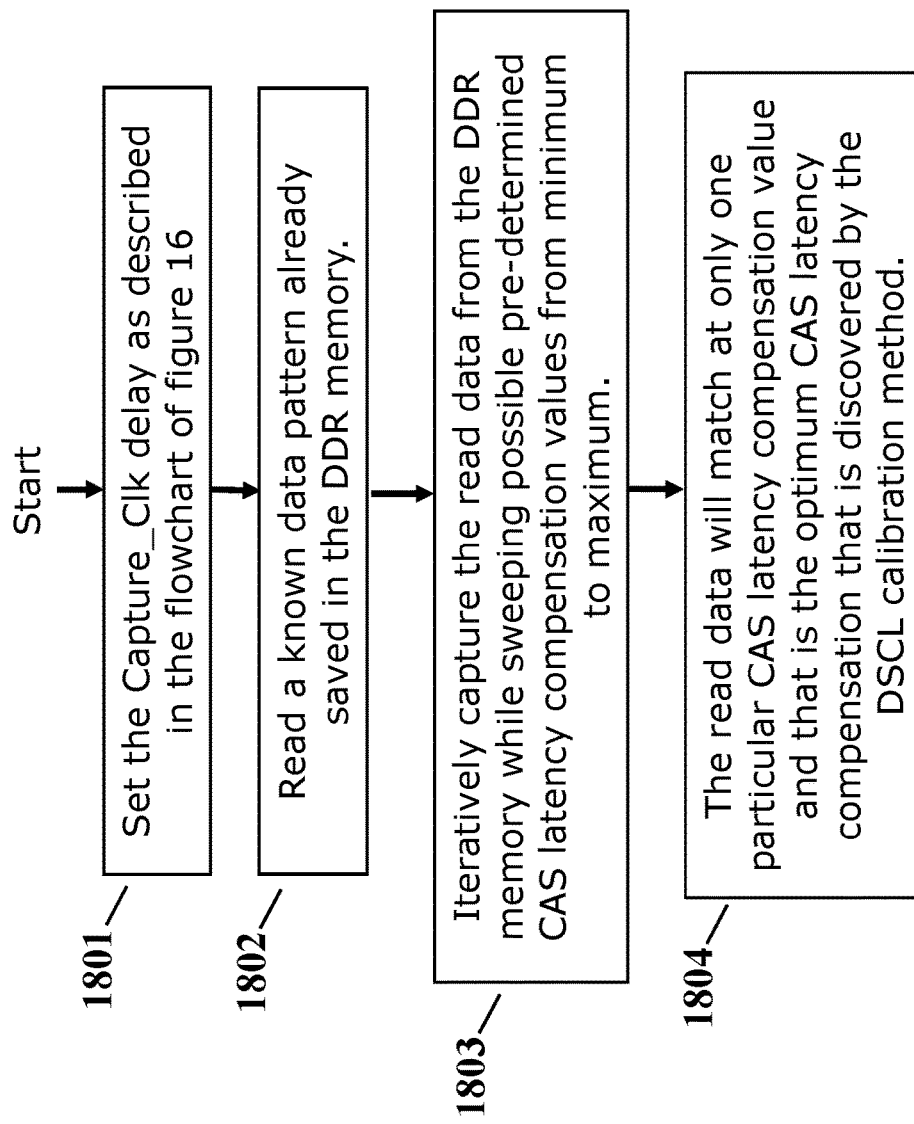
FIG. 18 shows a flowchart describing the process of iteratively capturing read data from the DDR memory while sweeping different CAS latency compensation values to determine the settings for the DDR memory controller that provide the optimum CAS latency compensation.

FIG. 17 shows the circuitry within the DSCL functionality that is utilized during the portion of the calibration sequence described in the process of FIG. 18. According to FIG. 11, read data has been captured in flip-flop 1103 by Capture_Clk to produce Rd_Data_Cap 1110. Rd_Data_Cap 1110 is then captured in each of flip-flops 1701 on an edge of Core_Clk and are enabled to register Rd_Data_Cap by one of counters 1702 which themselves are also clocked by Core_Clk. Counters 1702 are enabled to start counting by a Read Command 1703 issued by the DSCL functionality. The outputs of flip-flops 1701 each go to a data comparator 1704 where they are compared with a predefined data value 1705 which is stored in the DDR memory controller in location 1706 and has also been previously placed in the DDR memory itself as described in the process of FIG. 18. The outputs of the data comparators enter encoder 1707 whose output 1419 controls multiplexer 1006 which chooses a flip-flop chain delay path from those previously described in FIG. 7.

FIG. 18 shows a procedure for operating the DDR memory controller in order to calibrate the controller during dynamic operation, and in particular to determine the optimum overall CAS latency compensation. First, in step 1801 the Capture_Clk delay is set to the previously determined optimum value according to the procedure described in the flowchart of FIG. 16. In step 1802 a known data pattern is read from a DDR memory connected to the DDR memory controller. This known data pattern originates in a stored location 1706 in the DDR controller device and would typically have been previously saved or located in the DDR memory. If such a pattern is not available in the DDR memory, an appropriate pattern would be written to the DDR memory before this step and subsequent steps are executed. If, in order to write such a known data pattern to the DDR memory, existing data at those memory locations needs to be preserved, the existing data may be read out and saved inside the memory controller or at another (unused) memory location, and then may be restored after the DSCL dynamic calibration sequence per FIGS. 16 and 18 is run. In step 1803 read data is captured from the DDR memory in an iterative manner while sweeping possible predetermined CAS latency compensation values from a minimum to a maximum value utilizing the different delay paths that can be chosen with the circuitry shown in FIG. 17. In step 1804, when the read data matches at a particular CAS latency compensation, the parameters and settings that produced that optimum value of CAS latency compensation, i.e. the chosen delay path through the flip-flop chains feeding multiplexer 706 in combination with the previously determined optimum Capture_Clk delay, are recorded as the optimum parameters for the CAS latency compensation value and used thereafter during normal operation until another dynamic calibration sequence is performed.

Half-Frequency Operation and Dual-Mode DQS Gating

Circuits and methods are described for a DDR memory controller where two different DQS gating modes are utilized. These gating modes together ensure that the DQS signal, driven by a DDR memory to the memory controller, is only available when read data is valid, thus eliminating capture of undesirable data into the memory controller caused by glitches when DQS is floating. Two types of gating logic are used: Initial DQS gating logic, and Functional DQS gating logic. The Initial gating logic has additional margin to allow for the unknown round trip timing during initial bit levelling calibration. Eventually the memory controller will establish precise timing in view of the actual round-trip delay. Round trip delay is the difference between the instant when a read command is issued by the memory controller and the instant when the corresponding data from a DDR memory is received at the memory controller excluding the known and fixed number of clock cycle delays involved in fetching data in the DDR protocol. Even though this round trip delay has not been characterized when initial bit-levelling calibration is performed, it is useful to perform bit-levelling early in the overall calibration process as this makes subsequent phase and latency calibration for data capture more precise and consistent across all data bits. During bit-levelling calibration an alternating pattern of 1s and 0s is read from the memory and the memory controller is able to perform bit-levelling regardless of the round-trip delay due to the predictable nature of the pattern and the manner in which bit-leveling calibration operates. This does, however, require a wider window for DQS gating and hence the Initial gating mode as described herein is used. Please see co-pending U.S. application Ser. No. 13/797,200 for details on calibration for bit-levelling. DQS functional gating is optimized to gate DQS precisely as Capture_Clk delay and CAS latency compensation calibration is performed. This gating functionality is especially useful when data capture into a core clock domain is performed at half the DQS frequency in view of rising clock rates for DDR memories.

With newer DDR technologies, memory speeds are becoming faster and faster. This means that the period of the clocks are becoming smaller and smaller. This is problematic for successful data capture because the related timing windows also become smaller. By operating with some of the clocks involved in data capture at the half frequency, as well as other associated logic, the size of these timing windows can be increased. Whereas while operating at full frequency, SCL could theoretically choose a position for Capture_Clk in such a way that input DQS gating is not necessary, when running at half frequency such an option no longer exists. This is because the input DQS needs to be divided to half its frequency using a toggling flip-flop to produce a signal shown as d1_half_rate_dqs 2103 in FIG. 21. If d1_half_rate_dqs were to toggle because of a spurious noise pulse on input DQS 1903 in FIG. 19, or when DQS is toggling at other times not corresponding to a valid input being driven from the DRAM 1904, then it could have an opposite polarity from what is required to latch the input data from the DRAM correctly.

Especially when some of the capture-related clocks and logic are operated at half frequency, it can become problematic during a first run of bit-levelling calibration when the gating for input DQS 1902 may not yet be perfect. In such a condition, it may be unclear how to best open/close DQS gating, since write side bit-levelling may need the gate to be open either perfectly or for more time. An initial gating strategy is therefore used for the first bit-levelling calibration because it is more lenient in that it will leave the gate open for a larger amount of time before closing it. This does not cause a problem for the bit-leveling function to work properly since it does not depend on d1_half_rate_dqs to perform its function. This capability and extra margin is not needed after SCL calibration is performed, as described earlier in this specification with respect to Self-Configuring Logic 1001, because the gating can then be programmed more precisely within the functional gating mode using the information obtained by SCL.

This capability to use two gating modes of operation is also useful for an implementation even where the clocks are operated at full frequency, in view of the smaller available timing margins as memory access clock speeds continue to rise from year to year.

Figure 19:
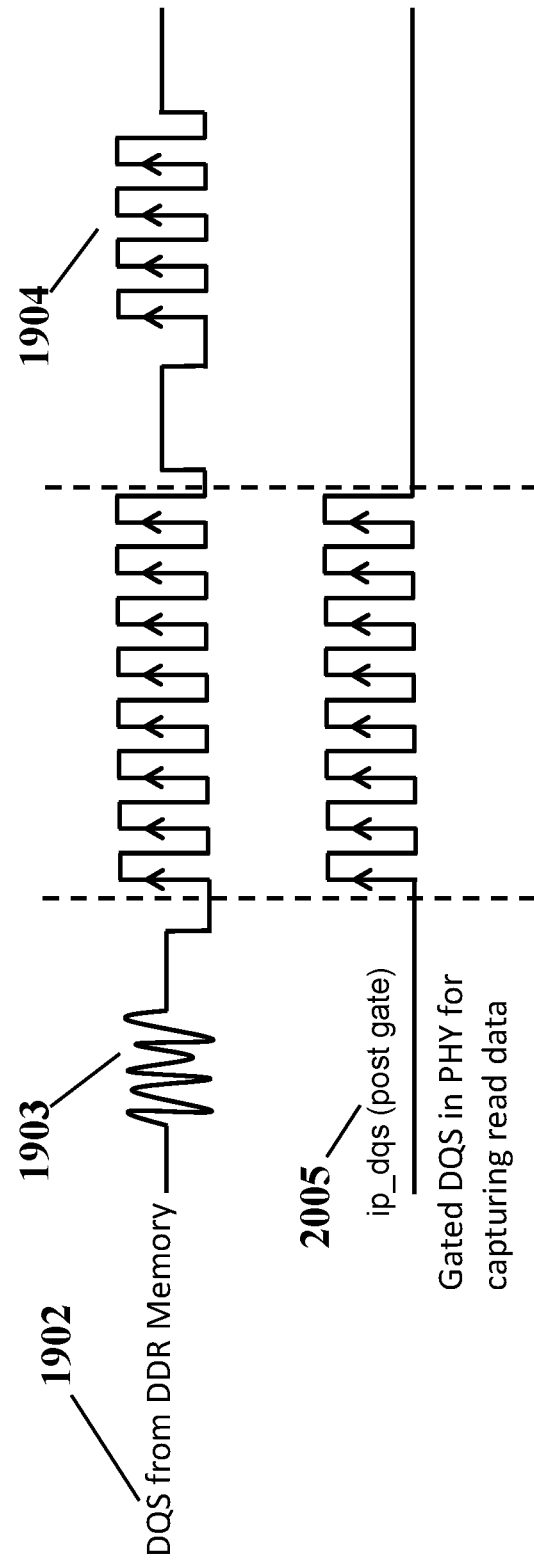
FIGS. 19-22 show circuit details and timing relationships for providing a memory interface that includes two different windows for gating key timing signals like DQS—a first that is large and allows for performing initial calibration functions when the precise timing is not yet known, and a second for gating key timing signals more precisely as timing relationships become more defined as the calibration process progresses.
Figure 20:
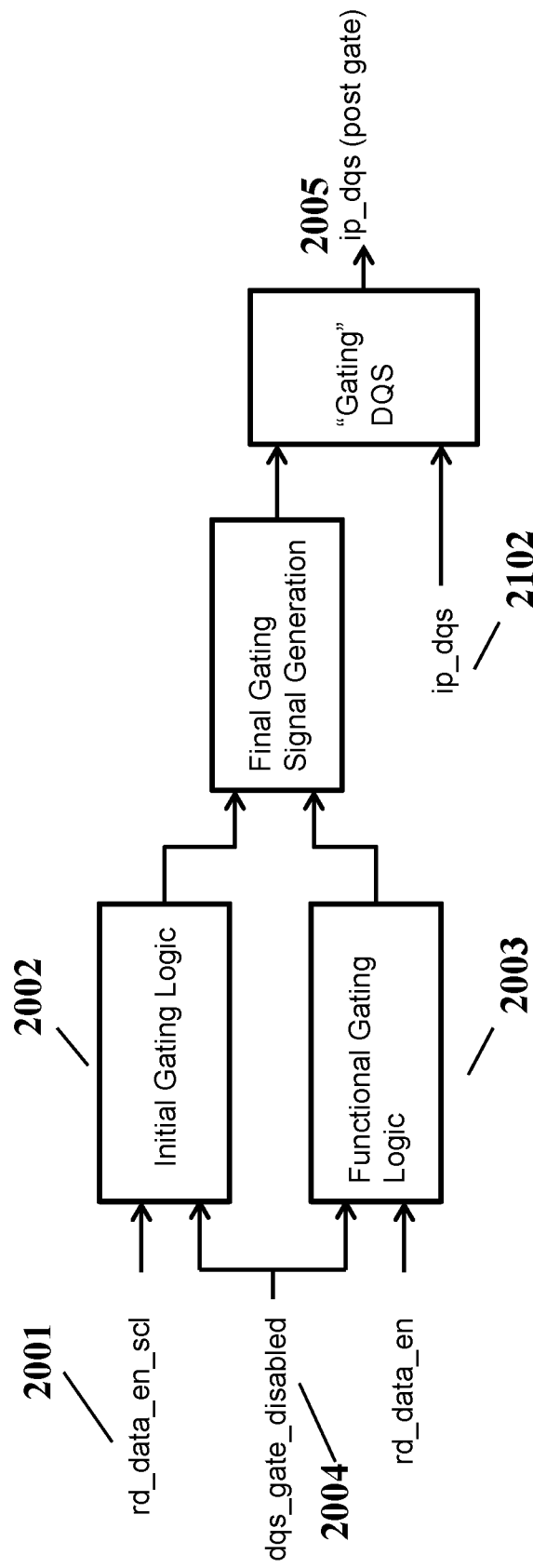

The waveform of FIG. 19 shows a hypothetical example of the goal of DQS Gating by only allowing the DQS pulses that correspond to the issued read command to be operated on by the memory controller. As shown in FIG. 20, there are two types of gating logic, the Initial gating logic 2002, and the Functional gating logic 2003. The difference between the two is how precisely they work. The Initial gating logic 2002 has additional margin to allow for the unknown input DQS round trip timing during initial bit-levelling calibration. The Functional gating logic 2003 gates DQS precisely based on the round trip timing information discovered and refined during SCL calibration. Regardless of which gating logic is active, either 2002 or 2003, the resulting output is a gated ip_dqs called ip_dqs (post gate) 2005. There is also a disable control 2004 that can be used which forgoes gating but it is not advised to turn it on with half-frequency mode since glitches can invert the phase of the divided DQS.

FIG. 20 shows a high-level block diagram representation for the logic used for both Initial DQS gating 2002 and for Functional DQS gating 2003. The Initial gating mode is only used for the first time that bit-levelling calibration is run. At this initial point in the calibration process, SCL calibration has not yet been run. Therefore the Functional gate timing would be imprecise if used at this stage of the calibration process. After the first time bit levelling is run using Initial DQS gating, Functional gating mode is used during SCL calibration and for functional operation after determination of precise timing values for Capture_clk 2105 and CAS latency calibration. Thereafter, whenever bit levelling or dynamic SCL calibration are run from time to time during functional system operation, the Functional gating timing is used.

Functional gating timing has not been optimized prior to the first run of SCL calibration for optimizing Capture_clk 2105 timing. During the first run of SCL calibration, the gate opening timing is not precise, so it is possible that for half-frequency operation—for applications where half-frequency functionality according to the present invention is used—the divided input DQS, called d1_half_rate_dqs 2103, has the opposite phase from what is required. This situation is automatically detected and corrected by SCL calibration as described below with respect to SCL Clock Domain Crossing. After SCL calibration has completed, the just discovered Capture_Clk and CAS latency settings are used to close the gate precisely, for functional operation and for any further calibration operations.

SCL Clock Domain Crossing and Half-Frequency Capture Logic

Figure 21:
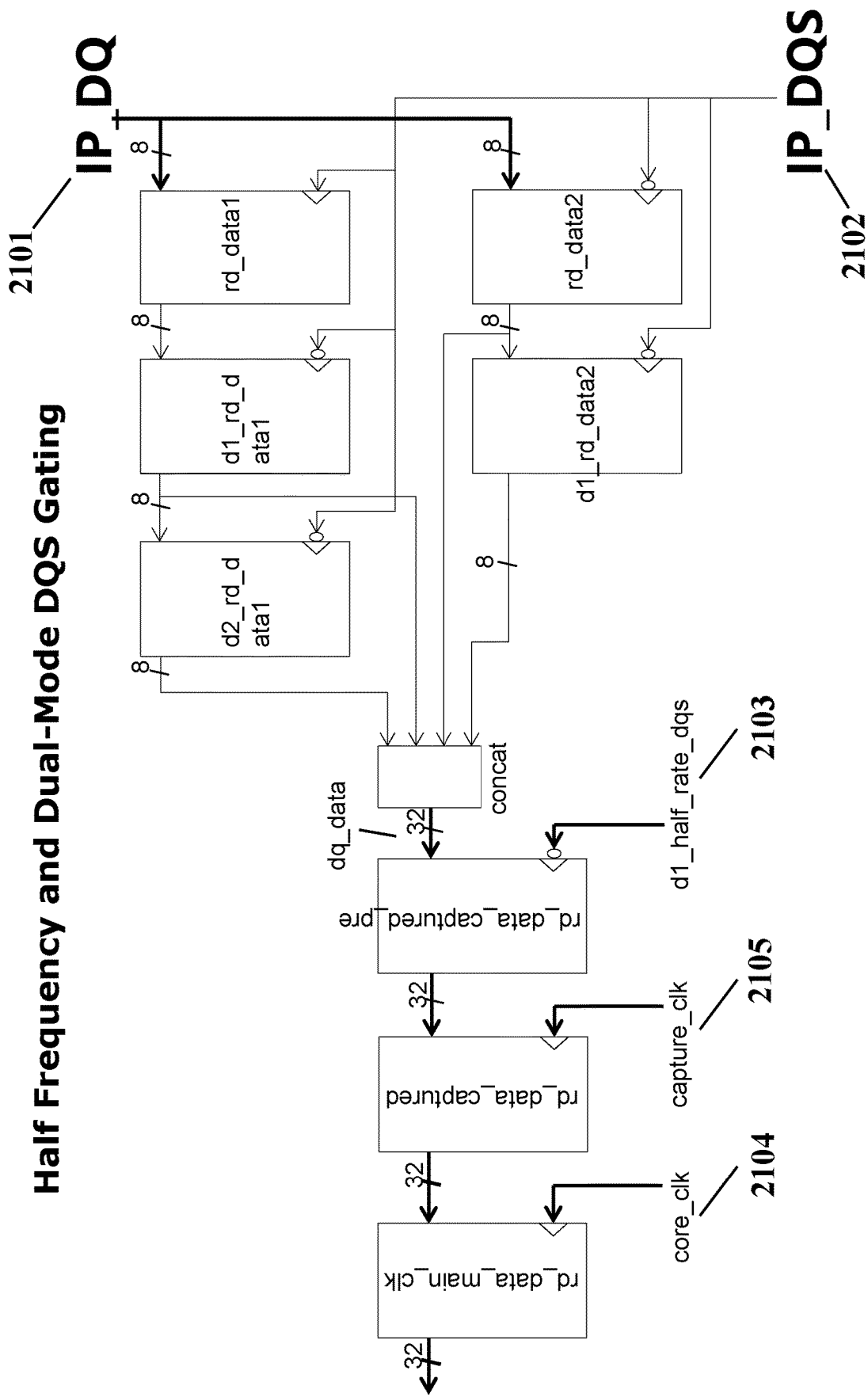
Figure 22:
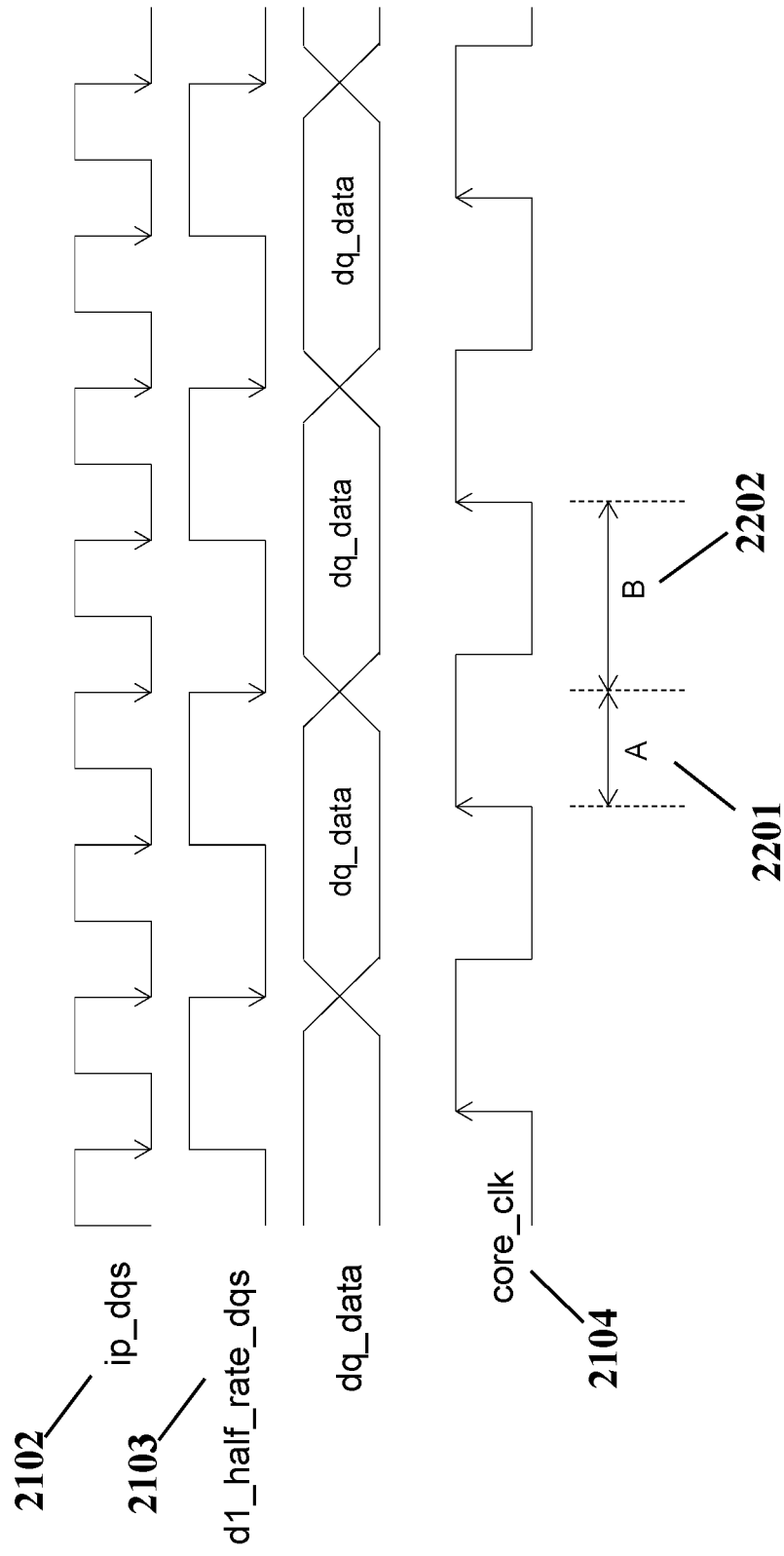

One exemplary circuit used to implement the read capture logic is shown in FIG. 21 for applications where half-frequency functionality according to the present invention is used. As described earlier in this specification, capture_clk 2105 is the variable delay clock which SCL will tune so that there is optimal setup and hold margins for clocking data from the input DDR3/DDR4 strobe domain to the memory controller's core clock domain, where it is captured by core_clk 2104.

During SCL operation, the memory controller will continuously look for the location of the second falling edge of ip_dqs 2102. This is the edge in which valid data on ip_dq 2101 will be available. The data will cross clock domains from this edge to the falling edge of d1_half_rate_dqs 2103 which happens on the same edge of ip_dqs that triggered d1_half_rate_dqs to go low. This is done to reduce latency on the read path but it must be noted that to check timing based on this, a multi-cycle path of zero is used to time the path during Static Timing Analysis. SCL will find the center between the rising edge of core_clk and the falling edge of the next d1_half_rate_dqs strobe, shown by points A 2201 and B 2202 in the FIG. 22. Whichever point gives the largest setup and hold margins—point B in the example below— will be set as the active edge location for capture_clk.

Phase Fixing

As described above, valid read data is available after the second falling edge of ip_dqs or the falling edge of the divided DQS, d1_half_rate_dqs. It is possible that d1_half_rate_dqs could start or become out of phase. If out of phase, the data read back will not be correct. SCL calibration has the ability to detect this situation. Once SCL finishes calibration, it will check to see if it failed or not. If it passed, the phase is correct and normal functionality will follow. If it failed, SCL will run CAS latency calibration again after flipping the polarity of d1_half_rate_dqs placing it back into phase. The setting for Capture_Clk will also be recalculated by moving point A in FIG. 22 either forward or backward by 1 cycle of ip_dqs based on whether A is lesser or greater than one cycle of ip_dqs.

Logic for Initial Gating During Initial Bit Levelling Calibration

In the Initial gating mode, the gate is extended 8 full rate cycles beyond the falling edge of rd_data_en_scl 2001 to ensure maximum round trip delay in receiving valid DQS pulses is accounted for. This is exemplary, and extension by other numbers of full rate cycles is possible.

Figure 23:
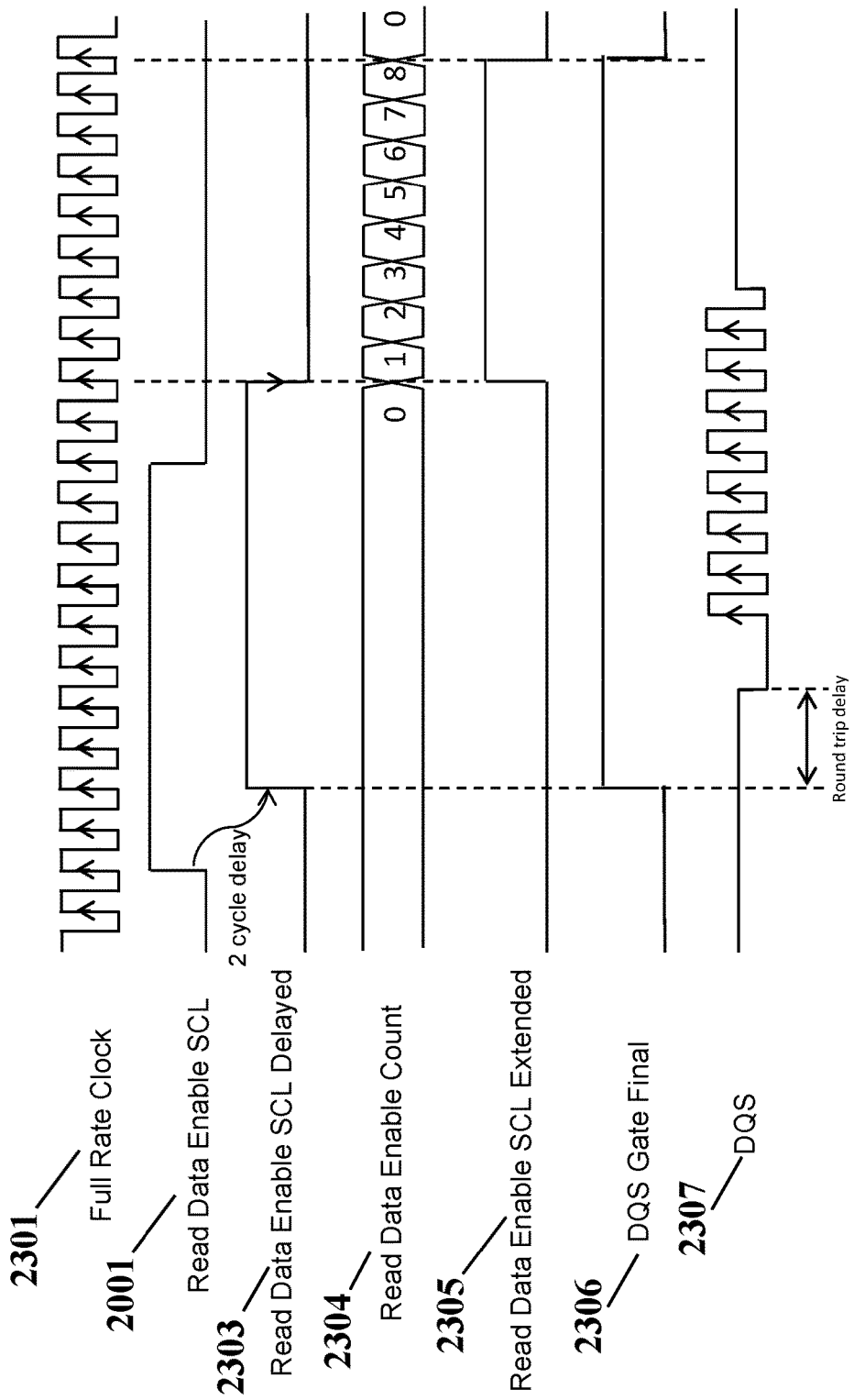

FIG. 23, shows an example timing diagram of the fundamental signals in initial ABC gating routine to create the final gating signal. The signals shown in FIG. 23 are defined as follows:

Full Rate Clock 2301: One of two clock domains in the memory controller with the same frequency as ip_dqs and is used sparingly as some portions of the memory controller must be in the full rate domain.

Read Data Enable SCL 2001: Read enable signal from the memory controller which is used for calibration purposes and to control the DQS gate signal.

Read Data Enable SCL Delayed 2303: This is the read data enable SCL signal but delayed by two full rate cycles.

Read Data Enable Count 2304: A counter which is used to extend the final DQS gate signal by eight full rate cycles.

Read Data Enable SCL Extended 2305: A one bit signal derived from the read data enable count to extend the final DQS gate by eight cycles.

DQS Gate Final 2306: This signal will gate DQS but it has no concept of round trip time and therefore opens earlier and closes later giving more margins. (NOTE: this signal is the same one used for functional gating, but the logic to have the gate open/close is different since the round trip time is known)

DQS 2307: The incoming DQS from the memory.

Note that in FIG. 23 the round trip delay here looks relatively small as the drawing has been simplified. Round trip delay is the time it takes for the read data and strobe to be received at the memory controller after the memory has received the read address and command issued by the memory controller. The read data enable SCL delayed signal will open before the DQS strobe is received by the memory controller as it is much more lenient.

Before SCL calibration has been run, the memory controller does not know anything about the round trip time and therefore the gate will not open/close perfectly. This is why Initial gating mode is used since it is much more lenient on when it opens and closes the gate, thus not interfering with bit levelling calibration. Again, Initial gating mode in half frequency mode is only used during the initial run of bit levelling calibration for both the read and write side. When the memory controller is going start reading data for calibration, it will generate a read data enable signal which takes in account the read latency of the memory. When this read data enable signal is used for gating, it is delayed further by two cycles. This is exemplary and could be delayed more or less. The delayed version of the read data enable signal will open the gate albeit a bit earlier than the time when the DQS from the memory reaches the memory controller. At the falling edge of the delayed read data enable signal, the memory controller will extend the gating signal by 8 full rate cycles and then will close it. The position at which it closes will be after the DQS has arrived at the memory controller from the memory.

Logic for Functional Gating (Functional Gating Logic)

The logic for generating the functional gating signal is more intricate. It is necessary to being gating shortly before the rising edge of the first DQS pulse during the preamble and to stop gating shortly after the last falling edge during the postamble as shown in FIG. 25.

Figure 24:
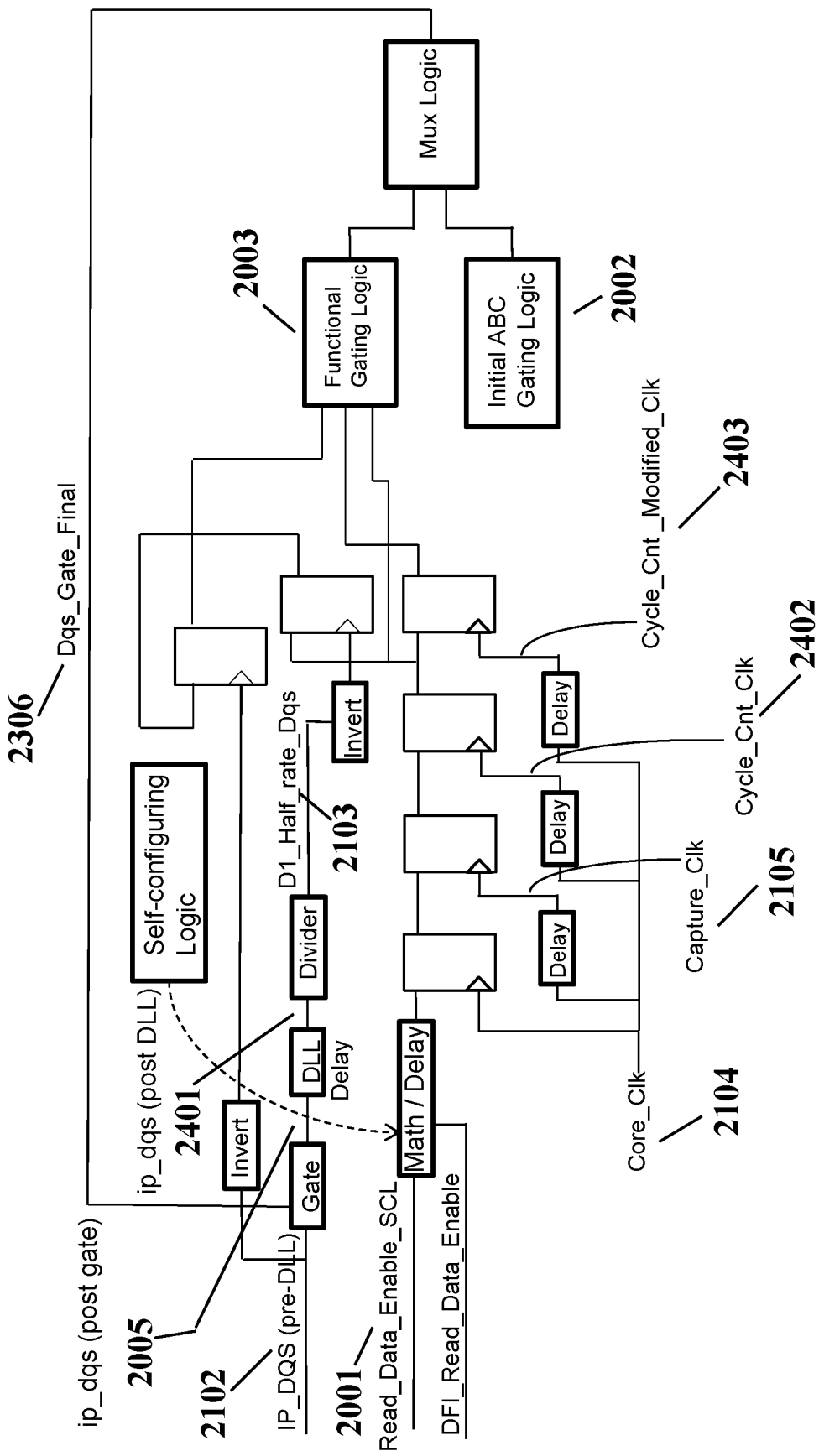
Figure 25:
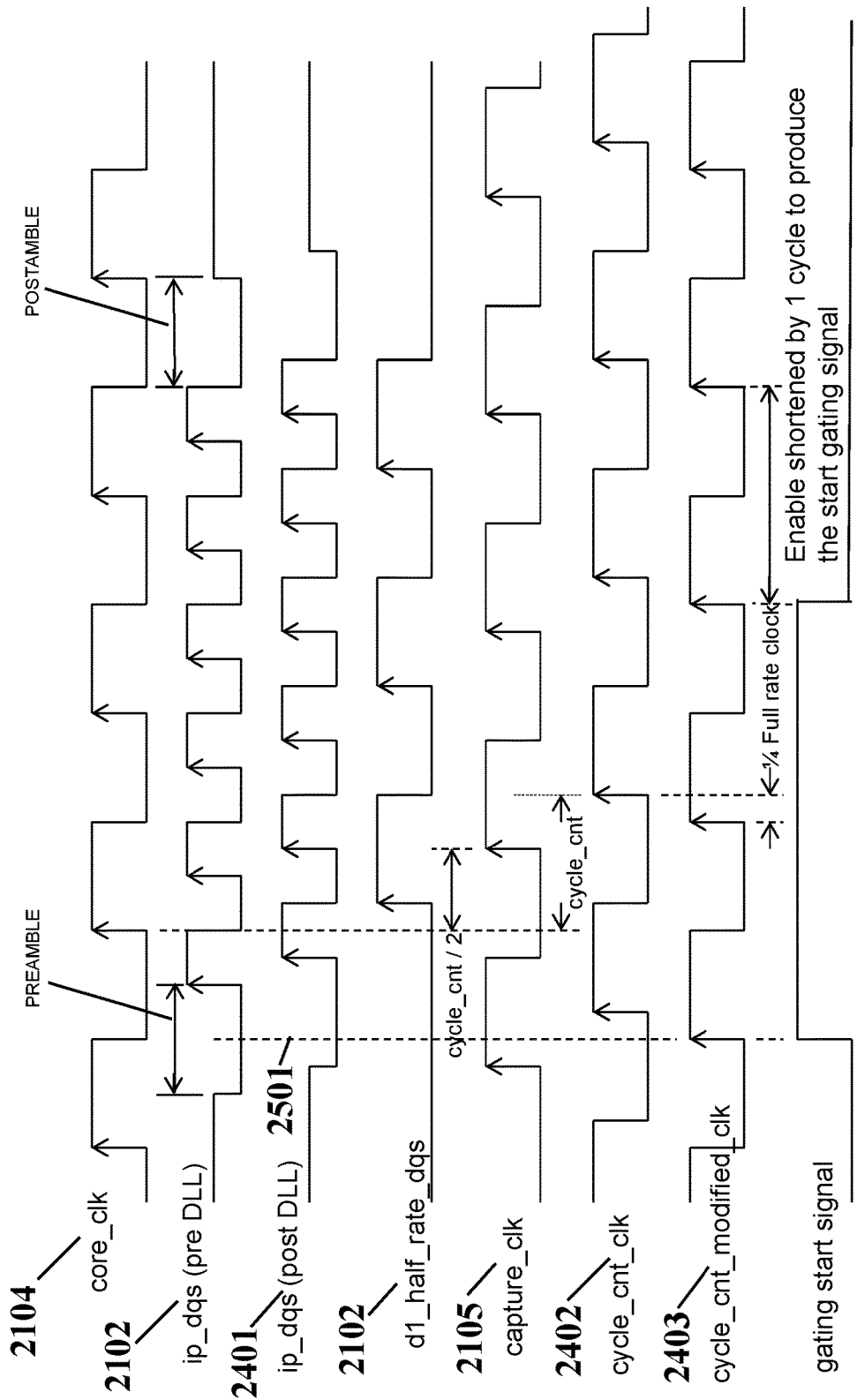

How each of the gating logic functions fits in the overall memory interface according to the invention is shown in the schematic block diagram per FIG. 24 in conjunction with the timing diagram of FIG. 25.

Gate Opening Timing for Functional Gating

Per FIG. 25, in order to begin gating just before the first pulse of DQS, it must be determined when the first pulse actually occurs with respect to something that is known. Note that there is also an analog or digital DLL that is used to delay the input DQS by ¼ cycle for centering it with respect to DQ. The waveforms of FIG. 25 show the timing of the gating signal with respect to ip_dqs prior 2102 to being delayed by the DLL (pre DLL) as well as after being delayed 2401 by the DLL (post DLL). In FIG. 25 with respect to half-frequency operation, d1_half_rate_dqs 2103 is a divided version of ip_dqs (post DLL) 2401 which toggles on every falling edge of ip_dqs (post DLL). When SCL calibration runs, it determines the phase difference between the rising edge of core_clk 2104 and the falling edge of d1_half_rate_dqs 2103 which corresponds to the second falling edge of ip_dqs (post DLL) 2401 and stores this value as a variable called cycle_cnt (this is the same as the SCL measurement point A mentioned previously with respect to FIG. 22). Therefore the invention uses cycle_cnt as a reference to determine when ip_dqs will pulse with respect to core_clk so gating can being beforehand.

First cycle_cnt_clk 2402 is created by delaying core_clock by the value cycle_cnt. This new clock (cycle_cnt_clk) has each positive edge aligned to each second falling edge of ip_dqs (post DLL). Another clock, cycle_cnt_modified_clk 2403 is generated ¼ Full rate clock cycle sooner or one and ¾ Full rate clock cycle later than cycle_cnt_clk (depending on whether cycle_cnt is greater than ¼ Full rate clock cycle or less than ¼ cycle respectively).

It can be seen that each positive edge of cycle_cnt_modified_clk 2403 is aligned to each second falling edge of ip_dqs (pre DLL) 2102 and is therefore centered in the middle of ip_dqs preamble time—as shown by the dotted line 2501 in FIG. 25.

Next, the read enable signal from the controller is registered into this new cycle_cnt_modified_clk domain using capture_clk and cycle_cnt_clk as staging clocks. Capture_Clk is guaranteed by SCL calibration to be positioned so that maximum setup and hold margins are obtained when transitioning between the core_clk and cycle_cnt_clk domains. Timing from cycle_cnt_clk to cycle_cnt_modified_clk is met by design. This read enable signal, once latched in the cycle_cnt_modified_clk domain, is used to signal the start of DQS gating. The clock cycle latency of the read enable signal is also adjusted based on SCL calculated CAS latency as described previously. Also the enable signal is shortened by 1 clock cycle compared to the length of the read burst so that it does not affect the gate closing timing.

Gate Closing

Figure 26:
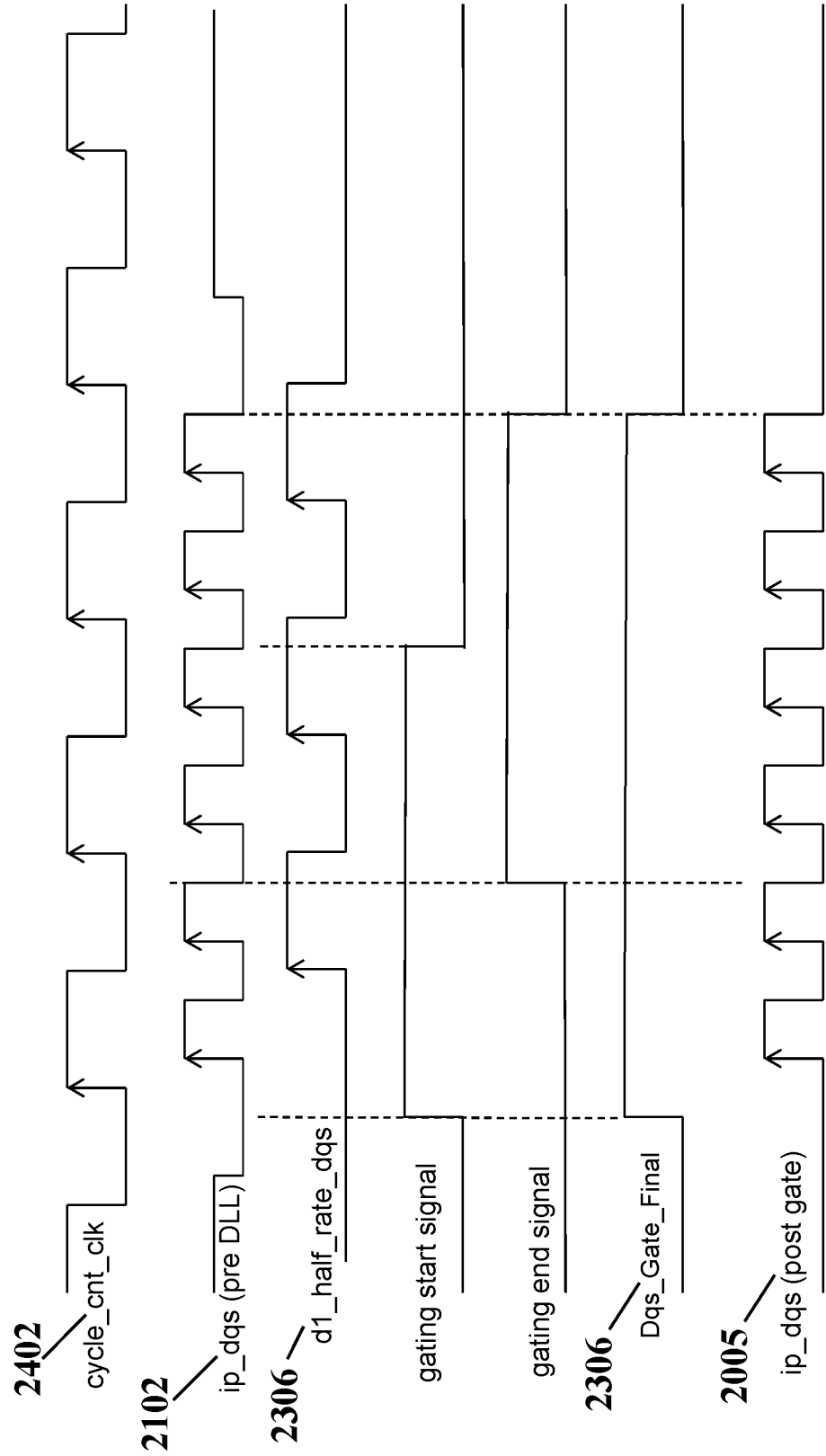

Per FIG. 26, the DQS gate is closed directly by the last falling edge of the final DQS pulse. This is done by latching the third staged read data enable signal (in cycle_cnt_clk domain) into the d1_half_rate_dqs domain.

Thus, the foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, unless otherwise specified, steps performed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A computer-implemented method, comprising the act of:
  configuring code to cause at least part of hardware to operate as a double data rate (DDR) memory controller, and to:
    produce a capture clock to time a read data path, where a timing of the capture clock is based on a first clock signal of a first clock,
    delay the first clock signal to produce a delayed first clock signal,
    adjust the delay such that at least one clock edge of the delayed first clock signal is placed nearer to at least one clock edge of: at least one data strobe (DQS), or at least one signal dependent on a DQS timing, and produce a modified timing of the capture clock based on the delay of the first clock signal.

2. The method of claim 1, and comprising the additional act of further configuring the code to cause the at least part of the hardware to operate such that the first clock signal is a core clock signal or a signal derived from at least the core clock signal.

3. The method of claim 1, and comprising the additional act of further configuring the code to cause the at least part of the hardware to issue a sequence of read commands so that at least one of: the at least one DQS toggles repeatedly, or the at least one signal dependent on the DQS timing toggles repeatedly.

4. The method of claim 1, and comprising the additional act of further configuring the code to cause the at least part of the hardware to operate such that the adjusting the delay produces a plurality of the clock edges of the delayed first clock signal that are a function of the least one clock edge.

5. The method of claim 1, and comprising the additional act of further configuring the code to cause the at least part of the hardware to operate such that the at least one clock edge includes the at least one clock edge of the at least one signal dependent on the DQS timing, and the at least one clock edge is a delayed version of another at least one DQS.

6. The method of claim 1, and comprising the additional act of further configuring the code to cause the at least part of the hardware to adjust the timing of the capture clock by monitoring the DQS timing or a signal dependent on the DQS timing.

7. The method of claim 1, and comprising the additional act of further configuring the code to cause the at least part of the hardware to produce the capture clock such that the capture clock runs at a same clock frequency as a memory clock of a memory.

8. The method of claim 1, and comprising the additional act of further configuring the code to cause the at least part of the hardware to produce the capture clock such that the capture clock at a clock frequency that is: the same as, a multiple of, or a sub-multiple of: a frequency of read data in the read data path.

9. The method of claim 1, and comprising the additional act of further configuring the code to cause the at least part of the hardware to use a calibration sequence to place the capture clock in a more optimum sampling position in a read data eye.

10. The method of claim 1, and comprising the additional act of further configuring the code to cause the at least part of the hardware to operate such that the capture clock is adjusted to place capture of read data closer to a middle of a data eye.

11. The method of claim 1, and comprising the additional act of further configuring the code to cause the at least part of the hardware to operate such that read data is captured directly in one or more registers.

12. The method of claim 1, and comprising the additional act of further configuring the code to cause the at least part of the hardware to operate such that read data is directly captured from memory.

13. The method of claim 1, and comprising the additional act of further configuring the code to cause the at least part of the hardware to operate such that the capture clock is adjusted to increase a reliability of a capture of read data from a memory.

14. The method of claim 1, and comprising the additional act of further configuring the code to cause the at least part of the hardware to operate such that a read timing training calibration sequence is performed to increase a reliability of a capture of read data from a memory.

15. The method of claim 14, and comprising the additional act of further configuring the code to cause the at least part of the hardware to operate such that at least one delay element is adjusted during the read timing training calibration sequence.

16. The method of claim 15, and comprising the additional act of further configuring the code to cause the at least part of the hardware to operate such that the adjustment of the at least one delay element causes an adjustment of a phase of the capture clock.

17. The method of claim 1, and comprising the additional act of further configuring the code to cause the at least part of the hardware to operate such that the capture clock is produced by a capture clock generation circuit.

18. The method of claim 17, and comprising the additional act of further configuring the code to cause the at least part of the hardware to operate such that the capture clock generation circuit adjusts a timing of the capture clock to match a phase of a memory clock of a memory.

19. The method of claim 1, and comprising the additional act of further configuring the code to cause the at least part of the hardware to operate such that the modified timing of the capture clock accommodates at least one of: a variation of voltage or a variation of temperature.

20. The method of claim 19, and comprising the additional act of further configuring the code to cause the at least part of the hardware to operate such that the accommodation is performed by at least one of: a capture clock generation circuit or a circuit driving a capture clock generation circuit.

21. The method of claim 1, and comprising the additional act of further configuring the code to cause the at least part of the hardware to calibrate at least a portion of a read data path of a DDR memory interface circuit at least one time in conjunction with a functional operation of a memory circuit; and compensate for at least one of a voltage variation or a temperature variation in order to provide an improved timing margin regardless as to whether a system timing changes over time.

22. The method of claim 1, and comprising the additional act of further configuring the code to cause the at least part of the hardware to use a delay element to delay the first clock signal; such that a delay of the delay element is set by a self-configuring logic circuit during a power-on initialization calibration operation.

23. The method of claim 1, and comprising the additional act of further configuring the code to cause the at least part of the hardware to operate such that the delay is adjusted such that the at least one clock edge of the delayed first clock signal is placed within a certain time of another signal edge according to a specified criterion.

24. The method of claim 23, wherein the certain time is one or more timing delay line increments.

25. The method of claim 23, wherein the specified criterion is a passing criterion.

26. The method of claim 25, wherein the passing criterion is a minimum number of delay line increments for which a test determines that read data is captured successfully.

27. The method of claim 26, wherein the test is an initialization test.

28. The method of claim 25, wherein the passing criterion is stored in the DDR memory controller.

29. The method of claim 25, wherein the passing criterion is a working system.

30. The method of claim 25, wherein the passing criterion is a minimum requirement for a successful test.

31. The method of claim 30, wherein the passing criterion is a working system.

32. The method of claim 25, wherein the passing criterion is a minimum requirement for a successful calibration test.

33. The method of claim 25, wherein the passing criterion includes a detection of a largest passing window.

34. The method of claim 1, and comprising the additional act of further configuring the code to cause the at least part of the hardware to operate such that the DDR memory controller produces a read capture clock from the capture clock.

35. The method of claim 1, and comprising the additional act of further configuring the code to cause the at least part of the hardware to operate such that the DDR memory controller produces a read capture clock internally from the capture clock.

36. The method of claim 35, and comprising the additional act of further configuring the code to cause the at least part of the hardware to operate such that the DDR memory controller uses the read capture clock to capture data to a core clock domain and does not directly use a DQS signal to capture the data to the core clock domain.

37. The method of claim 36, and comprising the additional act of further configuring the code to cause the at least part of the hardware to operate such that the DDR memory controller captures the data using a delayed value of the DQS signal, and then captures the data into the core clock domain using the capture clock.

38. The method of claim 1, and comprising the additional act of further configuring the code to cause the at least part of the hardware to operate such that the DDR memory controller produces another capture clock from the capture clock.

39. The method of claim 38, and comprising the additional act of further configuring the code to cause the at least part of the hardware to operate such that the DDR memory controller uses the capture clock to capture a first set of signals and the another capture clock to capture a second set of signals.

40. The method of claim 38, and comprising the additional act of further configuring the code to cause the at least part of the hardware to operate such that the DDR memory controller uses the capture clock and the another capture clock with one or more DDR memory devices.

41. The method of claim 38, and comprising the additional act of further configuring the code to cause the at least part of the hardware to operate such that the DDR memory controller uses at least one of the capture clock or the another capture clock, for one or more DDR memory devices.

42. The method of claim 1, and comprising the additional act of further configuring the code to cause the at least part of the hardware to operate such that the DDR memory controller produces a plurality of capture clocks, which include the capture clock.

43. The method of claim 42, and comprising the additional act of further configuring the code to cause the at least part of the hardware to operate such that the DDR memory controller uses at least one of the plurality of capture clocks to capture 16 bits of data.

44. The method of claim 42, and comprising the additional act of further configuring the code to cause the at least part of the hardware to operate such that the DDR memory controller uses at least one of the plurality of capture clocks to capture 8 bits of data.

45. The method of claim 42, and comprising the additional act of further configuring the code to cause the at least part of the hardware to operate such that the DDR memory controller uses at least one of the plurality of capture clocks to capture one or more DQS signals.

46. The method of claim 1, and comprising the additional act of further configuring the code to cause the at least part of the hardware to operate such that the production of the capture clock, the delay, the adjustment, and the production of the modified timing, comprise a timing calibration algorithm.

47. The method of claim 46, and comprising the additional act of further configuring the code to cause the at least part of the hardware to operate such that the DDR memory controller produces one or more signals that represent one or more timing calibration results of the timing calibration algorithm.

48. The method of claim 47, wherein the timing calibration algorithm aligns data from one or more DQS groups to reduce a difference in arrival times of the data at an interface to the DDR memory controller.

49. The method of claim 47, wherein the timing calibration algorithm reduces a latency that results from moving the data from a physical (PHY) domain to a core domain.

50. The method of claim 47, wherein the timing calibration algorithm centers the capture clock such that the capture is optimized.

51. The method of claim 50, wherein the optimization is performed across one or more bits.

52. The method of claim 50, wherein the capture clock performs a synchronization between one or more signals.

53. The method of claim 52, wherein the synchronization is read data synchronization.

54. The method of claim 52, wherein one of the one or more signals is synchronized to the capture clock.

55. The method of claim 52, wherein the synchronization is optimized for one or more groups of one or more bits.

56. The method of claim 55, wherein the optimization of the synchronization involves computation of an average value of a timing parameter for the one or more groups of the one or more bits.

57. The method of claim 56, wherein the one or more bits comprise a byte lane.

58. The method of claim 56, wherein the one or more bits comprise a plurality of byte lanes.

59. The method of claim 47, wherein the one or more signals includes one or more of:
one or more parameters resulting from the timing calibration algorithm,
one or more signals that indicate a memory initialization sequence has finished, or
one or more signals that report a pass or fail status of the timing calibration algorithm.

60. The method of claim 1, and comprising the additional act of further configuring the code to cause the at least part of the hardware to operate such that the DDR memory controller adjusts the delay in increments such that a capture clock delay is increased in increments.

61. The method of claim 1, and comprising the additional act of further configuring the code to cause the at least part of the hardware to produce the capture clock such that the capture clock runs at a fixed frequency related to a frequency of a memory clock of a memory.

62. The method of claim 1, and comprising the additional act of further configuring the code to cause the at least part of the hardware to operate such that the DDR memory controller includes therein a self-configuring logic (SCL) circuit that controls a phase of the capture clock during a timing calibration.

63. The method of claim 62, wherein the SCL circuit records information about one or more adjustments of the phase of the capture clocks during the timing calibration.

64. The method of claim 1, and comprising the additional act of further configuring the code to cause the at least part of the hardware to operate such that at least one of a plurality of clocks are dynamically adjusted relative to at least one other of the plurality of clocks, during system operation.

65. The method of claim 64, wherein the plurality of clocks include at least one of: one or more reference clocks, or one or more core clocks.

66. The method of claim 1, and comprising the additional act of further configuring the code to cause the at least part of the hardware to operate such that the DDR memory controller adjusts the delay using one or more adjustments of at least one fixed delay value.

67. The method of claim 66, wherein the one or more adjustments are one or more delay increments.

68. The method of claim 66, and comprising the additional act of further configuring the code to cause the at least part of the hardware to operate such that the DDR memory controller counts the one or more adjustments.

69. The method of claim 1, and comprising the additional act of further configuring the code to cause the at least part of the hardware to operate such that the DDR memory controller includes a FIFO including one or more registers that form a variable delay that is calibrated to reflect a read latency of a DDR interface to the DDR memory controller.

70. The method of claim 69, and comprising the additional act of further configuring the code to cause the at least part of the hardware to operate such that the DDR memory controller utilizes a latency calibration algorithm to select a number of the one or more registers to use for the FIFO to compensate for a particular delay in a memory system that includes the DDR memory controller.

71. The method of claim 70, and comprising the additional act of further configuring the code to cause the at least part of the hardware to operate such that a particular value of the read latency is achieved using the latency calibration algorithm, by sweeping latency compensation values of the latency calibration algorithm and by the adjustment of the delay.

72. The method of claim 71, and comprising the additional act of further configuring the code to cause the at least part of the hardware to operate such that the particular value of the read latency is achieved by performing one or more reads of read data, and checking the read data for all read bits thereof.

73. The method of claim 71, and comprising the additional act of further configuring the code to cause the at least part of the hardware to operate such that the sweeping of the latency compensation values of the latency calibration algorithm and the adjusting the delay are both performed iteratively until one or more pass requirements are met.

74. The method of claim 73, wherein a completion of the iterative performance of the sweeping of the latency compensation values of the latency calibration algorithm and the adjusting the delay establishes one or more timing values corresponding to a working system.

75. The method of claim 74, wherein the delay is centered within a range of timing values corresponding to the working system.

76. The method of claim 71, wherein the latency calibration algorithm adjusts the latency compensation values until one or more reads fail in order to identify a minimum latency value for more reliable operation.

77. The method of claim 1, and comprising the additional act of further configuring the code to cause the at least part of the hardware to operate such that the DDR memory controller adjusts the delay iteratively until a plurality of capture clock delay value iterations are complete, or one or more pass requirements are not met.

78. The method of claim 77, wherein the one or more pass requirements require that a system is working.

79. The method of claim 1, and comprising the additional act of further configuring the code to cause the at least part of the hardware to operate such that the DDR memory controller adjusts the delay until capture clock delay values are exhausted, or until a system stops working.

80. The method of claim 1, and comprising the additional act of further configuring the code to cause the at least part of the hardware to operate such that DQS signals in a DDR memory controller core clock domain are used only during write operations.

81. The method of claim 1, and comprising the additional act of further configuring the code to cause the at least part of the hardware to operate such that DQS signals in the DDR memory controller are used to capture data before the data is synchronized to a core clock using the capture clock.

82. The method of claim 1, and comprising the additional act of further configuring the code to cause the at least part of the hardware to operate such that delay adjustment of the capture clock is part of a read calibration process that include a calibration of read latency.

83. The method of claim 1, wherein the at least one signal dependent on the DQS timing is a data signal, a signal derived from the data signal, or a signal derived from a signal whose timing depends on the DQS timing.

84. The method of claim 1, wherein the first clock signal; the delayed first clock signal; the capture clock; or a signal derived from the first clock signal, the delayed first clock signal, or the capture clock, is used to sample a DQS signal or a delayed DQS signal.

85. The method of claim 84, and comprising the additional act of further configuring the code to cause the at least part of the hardware to operate such that the delaying is performed using one or more clock delay elements and the sampling is performed at different clock delay increments.

86. The method of claim 85, and comprising the additional act of further configuring the code to cause the at least part of the hardware to operate such that, while the delaying and the sampling are performed, a number of delay increments is recorded which correspond to each of a plurality of transitions on the sampled DQS signal or delayed DQS signal.

87. The method of claim 86, and comprising the additional act of further configuring the code to cause the at least part of the hardware to operate such that an optimum delay value is computed using the one or more clock delay elements to produce an optimum capture clock signal.

88. The method of claim 3, and comprising the additional act of further configuring the code to cause the at least part of the hardware to operate such that the at least one DQS toggles that repeatedly, or the at least one signal dependent on the DQS timing that toggles repeatedly; toggles for a fixed period of time.

89. The method of claim 3, and comprising the additional act of further configuring the code to cause the at least part of the hardware to operate such that the at least one DQS toggles that repeatedly, or the at least one signal dependent on the DQS timing that toggles repeatedly; toggles for a variable period of time.

90. The method of claim 1, and comprising the additional act of further configuring the code to cause the at least part of the hardware to operate such that a core clock signal is derived from the first clock signal.

91. The method of claim 1, and comprising the additional act of further configuring the code to cause the at least part of the hardware to issue a sequence of read commands so that at least one of: the at least one DQS toggles repeatedly, or the at least one signal dependent on the DQS timing toggles.

92. The method of claim 1, and comprising the additional act of further configuring the code to cause the at least part of the hardware to operate such that the adjusting the delay produces a plurality of the clock edges of the delayed first clock signal, such that a timing of one or more of the clock edges of the delayed first clock signal is derived from the timing of the least one clock edge.

93. The method of claim 1, and comprising the additional act of further configuring the code to cause the at least part of the hardware to produce the capture clock such that the capture clock runs at a multiple or a sub-multiple of a memory clock of a memory.

94. The method of claim 1, and comprising the additional act of further configuring the code to cause the at least part of the hardware to use an initialization sequence to place the capture clock in a more optimum sampling position in a read data eye.

95. The method of claim 1, and comprising the additional act of further configuring the code to cause the at least part of the hardware to operate such that the capture clock is adjusted to maximize a probability of a capture of read data from a memory.

96. The method of claim 1, and comprising the additional act of further configuring the code to cause the at least part of the hardware to operate such that a read timing training calibration sequence or a read timing training initialization sequence is performed to maximize a probability of a capture of read data from a memory.

97. The method of claim 1, and comprising the additional act of further configuring the code to cause the at least part of the hardware to operate such that a timing of one or more clock edges of the capture clock is adjusted to place a capture of read data closer in timing to a middle of a data eye.

98. The method of claim 97, and comprising the additional act of further configuring the code to cause the at least part of the hardware to operate such that the adjustment of the timing of one or more clock edges of the capture clock is performed continuously during operation.

99. The method of claim 1, and comprising the additional act of further configuring the code to cause the at least part of the hardware to use a calibration sequence or an initialization sequence to locate one or more of clock edges of the capture clock in a more optimum sampling position in a read data eye.

100. The method of claim 1, and comprising the additional act of further configuring the code to cause the at least part of the hardware to operate such that the DDR memory controller includes therein a self-configuring logic (SCL) circuit that performs a latency calibration algorithm that sweeps latency compensation values from a minimum value to a maximum value.

101. The method of claim 100, wherein the minimum value is zero.

102. The method of claim 99, wherein at least one of:
only the code is configured;
the code is configured such that only part of the code is subject to the configuring;
the code is configured such that an entirety of the code is subject to the configuring;
the code is configured such that at least a portion of the code that is subject to the configuring, is also subject to the further configuring;
the code is configured such that at least a portion of the code that is subject to the configuring, is the same as at least a portion of the code that is subject to the further configuring;
the code is configured such that at least a portion of the code that is subject to the configuring, is different from at least a portion of the code that is subject to the further configuring;
the code is configured such that a first part of the code is subject to the configuring, and a second part of the code is subject to the further configuring;
the at least part of the hardware includes an entirety of the hardware;
the at least part of the hardware includes only a subset of the hardware;
the timing of the capture clock is only based on the first clock signal of the first clock;
the timing of the capture clock is based on the first clock signal of the first clock, in addition to at least one other factor;
each instance of the production includes at least one of creating from nothing, making something that exists available, or making something that exists available after modifying the same;
the delay is adjusted only once;
the delay is adjusted multiple times;
the delay is adjusted iteratively;
the delay is adjusted such that the at least one clock edge of the delayed first clock signal is placed nearer to the at least one data strobe (DQS);
the delay is adjusted such that the at least one clock edge of the delayed first clock signal is placed nearer to the at least one signal dependent on the DQS timing;
the delay is adjusted such that the at least one clock edge of the delayed first clock signal is placed nearer to the at least one data strobe (DQS), and the at least one signal dependent on the DQS timing;
the delay is adjusted such that the at least one clock edge of the delayed first clock signal is placed nearer, by moving the at least one clock edge of the delayed first clock signal from a first timing location, to a second timing location that is nearer;
the first clock signal is a core clock signal;
the first clock signal is a signal derived from the core clock signal;
the capture clock is used to clock a flip-flop, a latch, or a register;
the capture clock is used to clock a flip-flop, a latch, or a register, where a data input of the flip-flop, a data input of the latch, or a data input of the register is the read data, and where the clocking of the flip-flop, the latch or the register acts to capture data that is then output from the flip-flop, the latch, or the register;
the capture clock is used to capture the read data into a core clock domain;
the capture clock is used to capture the read data into a core clock domain, including a synchronization of timing;

the capture clock is produced by a delay element;
the capture clock is produced by a core clock delay element;
the capture clock is used to clock a core domain register;
the capture clock is positioned to capture the read data;
the capture clock is positioned in a passing window;
the capture clock is positioned in a center of a passing window;
the capture clock is used to time the read data path, by controlling a timing of data reads via the read data path;
the capture clock is used to time the read data path, by controlling at least one aspect of the timing of data reads via the read data path;
the capture clock is used to time the read data path, by controlling a timing of data communication via the read data path;
the capture clock is used to time the read data path, by controlling at least one aspect of data communication via the read data path;
the capture clock is used to capture the read data, by reading the read data;
the capture clock is used to capture the read data, by identifying and receiving the read data;
the code is a language description of hardware;
the code allows generation of a language description of hardware;
the code is a bitstream;
the code is a bitstream used to program the at least portion of the circuitry;
the code is used in an integrated circuit;
the code is configured to accommodate one or more particular clock frequencies;
the code is configured to accommodate a particular type of DDR memory;
the configuring includes generating;
the configuring includes creating;
the configuring includes modifying;
the configuring includes programming;
the modified timing of the capture clock is produced to constantly position at least one of a rising edge or a falling edge of the capture clock within a memory read data window such that the at least one of a rising edge or a falling edge is at the center of the memory read data window; or
the modified timing of the capture clock is produced to constantly position at least one of a rising edge or a falling edge of the capture clock within a memory read data window such that the at least one of a rising edge or a falling edge is in the middle of the memory read data window;
the at least one DQS includes at least one signal generated by the memory and aligned with at least one edge of a read data signal;
the at least one DQS includes at least one signal generated by the memory and aligned with at least one edge of a read data signal, where the at least one signal generated by the memory is designed to be used in order to capture read data, and where one edge or both edges of the at least one signal generated by the memory is designed to be used in order to capture read data;
the at least one DQS includes a strobe signal generated by a memory system;
the at least one DQS includes a timing signal generated by a memory system;
the at least one DQS includes a signal generated by a memory system in order to allow the capture of read data;
the at least one DQS is delayed in order to capture read data;
the at least one DQS is gated in order to capture read data;
the at least one DQS is part of a DQS clock domain;
the at least one DQS is shifted in phase in order to capture data;
the configuring act is not a step;
the at least one DQS is delayed as part of a power on initialization test; or
the at least one DQS is delayed as part of a calibration operation.

103. The method of claim 100, wherein at least six (6) of:
only the code is configured;
the code is configured such that only part of the code is subject to the configuring;
the code is configured such that an entirety of the code is subject to the configuring;
the code is configured such that at least a portion of the code that is subject to the configuring, is also subject to the further configuring;
the code is configured such that at least a portion of the code that is subject to the configuring, is the same as at least a portion of the code that is subject to the further configuring;
the code is configured such that at least a portion of the code that is subject to the configuring, is different from at least a portion of the code that is subject to the further configuring;
the code is configured such that a first part of the code is subject to the configuring, and a second part of the code is subject to the further configuring;
the at least part of the hardware includes an entirety of the hardware;
the at least part of the hardware includes only a subset of the hardware;
the timing of the capture clock is only based on the first clock signal of the first clock;
the timing of the capture clock is based on the first clock signal of the first clock, in addition to at least one other factor;
each instance of the production includes at least one of creating from nothing, making something that exists available, or making something that exists available after modifying the same;
the delay is adjusted only once;
the delay is adjusted multiple times;
the delay is adjusted iteratively;
the delay is adjusted such that the at least one clock edge of the delayed first clock signal is placed nearer to the at least one data strobe (DQS);
the delay is adjusted such that the at least one clock edge of the delayed first clock signal is placed nearer to the at least one signal dependent on the DQS timing;
the delay is adjusted such that the at least one clock edge of the delayed first clock signal is placed nearer to the at least one data strobe (DQS), and the at least one signal dependent on the DQS timing;
the delay is adjusted such that the at least one clock edge of the delayed first clock signal is placed nearer, by moving the at least one clock edge of the delayed first clock signal from a first timing location, to a second timing location that is nearer;
the first clock signal is a core clock signal;
the first clock signal is a signal derived from the core clock signal;
the capture clock is used to clock a flip-flop, a latch, or a register;

the capture clock is used to clock a flip-flop, a latch, or a register, where a data input of the flip-flop, a data input of the latch, or a data input of the register is the read data, and where the clocking of the flip-flop, the latch or the register acts to capture data that is then output from the flip-flop, the latch, or the register;

the capture clock is used to capture the read data into a core clock domain;

the capture clock is used to capture the read data into a core clock domain, including a synchronization of timing;

the capture clock is produced by a delay element;

the capture clock is produced by a core clock delay element;

the capture clock is used to clock a core domain register;

the capture clock is positioned to capture the read data;

the capture clock is positioned in a passing window;

the capture clock is positioned in a center of a passing window;

the capture clock is used to time the read data path, by controlling a timing of data reads via the read data path;

the capture clock is used to time the read data path, by controlling at least one aspect of the timing of data reads via the read data path;

the capture clock is used to time the read data path, by controlling a timing of data communication via the read data path;

the capture clock is used to time the read data path, by controlling at least one aspect of data communication via the read data path;

the capture clock is used to capture the read data, by reading the read data;

the capture clock is used to capture the read data, by identifying and receiving the read data;

the code is a language description of hardware;

the code allows generation of a language description of hardware;

the code is a bitstream;

the code is a bitstream used to program the at least portion of the circuitry;

the code is used in an integrated circuit;

the code is configured to accommodate one or more particular clock frequencies;

the code is configured to accommodate a particular type of DDR memory;

the configuring includes generating;

the configuring includes creating;

the configuring includes modifying;

the configuring includes programming;

the modified timing of the capture clock is produced to constantly position at least one of a rising edge or a falling edge of the capture clock within a memory read data window such that the at least one of a rising edge or a falling edge is at the center of the memory read data window; or the modified timing of the capture clock is produced to constantly position at least one of a rising edge or a falling edge of the capture clock within a memory read data window such that the at least one of a rising edge or a falling edge is in the middle of the memory read data window;

the at least one DQS includes at least one signal generated by the memory and aligned with at least one edge of a read data signal;

the at least one DQS includes at least one signal generated by the memory and aligned with at least one edge of a read data signal, where the at least one signal generated by the memory is designed to be used in order to capture read data, and where one edge or both edges of the at least one signal generated by the memory is designed to be used in order to capture read data;

the at least one DQS includes a strobe signal generated by a memory system;

the at least one DQS includes a timing signal generated by a memory system;

the at least one DQS includes a signal generated by a memory system in order to allow the capture of read data;

the at least one DQS is delayed in order to capture read data;

the at least one DQS is gated in order to capture read data;

the at least one DQS is part of a DQS clock domain;

the at least one DQS is shifted in phase in order to capture data;

the configuring act is not a step;

the at least one DQS is delayed as part of a power on initialization test; and the at least one DQS is delayed as part of a calibration operation.

104. The method of claim 1, wherein the code is configured, and comprising the additional act of causing storage of the code.

* * * * *